(12) United States Patent
Usui et al.

(10) Patent No.: US 9,365,001 B2
(45) Date of Patent: Jun. 14, 2016

(54) THERMALLY CONDUCTIVE SHEET AND PROCESS FOR PRODUCING SAME

(71) Applicant: DEXERIALS CORPORATION, Tokyo (JP)

(72) Inventors: Hiroyuki Usui, Tochigi (JP); Keisuke Aramaki, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/323,423

(22) Filed: Jul. 3, 2014

(65) Prior Publication Data

US 2014/0349067 A1 Nov. 27, 2014

Related U.S. Application Data

(62) Division of application No. 13/702,438, filed as application No. PCT/JP2011/063955 on Jun. 17, 2011, now Pat. No. 8,808,607.

(30) Foreign Application Priority Data

Jun. 17, 2010 (JP) ................................. 2010-138334
Jun. 17, 2010 (JP) ................................. 2010-138417
Mar. 31, 2011 (JP) ................................. 2011-079976

(51) Int. Cl.
*B29D 7/01* (2006.01)
*B29D 7/00* (2006.01)
(Continued)

(52) U.S. Cl.
CPC .. *B29D 7/01* (2013.01); *B26D 1/08* (2013.01); *B26D 3/28* (2013.01); *B26D 7/086* (2013.01);
(Continued)

(58) Field of Classification Search
None
See application file for complete search history.

(56) References Cited

U.S. PATENT DOCUMENTS 5,318,420 A * 6/1994 Blaimschein .............. 425/174.2
6,251,978 B1 6/2001 McCullough
(Continued)

FOREIGN PATENT DOCUMENTS

EP 1 352 922 A2 10/2003
EP 1 865 553 A2 12/2007
(Continued)

OTHER PUBLICATIONS

Sep. 27, 2011 International Search Report issued in International Application No. PCT/JP2011/063955 (with translation).
(Continued)

*Primary Examiner* — Jeffrey Wollschlager
(74) *Attorney, Agent, or Firm* — Oliff PLC

(57) ABSTRACT

A thermally conductive sheet has cut surfaces with low surface roughness and hence shows reduced thermal resistance at the interfaces, and high thermal conductivity in the thickness direction. Thus, the thermally conductive sheet can be interposed between any of various heat sources and a radiation member. The process for producing the thermally conductive sheet includes at least: an extrusion molding step in which a thermally conductive composition containing a polymer, an anisotropic thermally conductive filler, and a filler is extruded with an extruder to thereby mold an extrusion-molded product in which the anisotropic thermally conductive filler has been oriented along the extrusion direction; a curing step in which the extrusion-molded product is cured to obtain a cured object; and a slicing step in which the cured object is sliced into a given thickness with an ultrasonic cutter in the direction perpendicular to the extrusion direction.

5 Claims, 16 Drawing Sheets

(51) Int. Cl.
| | |
|---|---|
| B06B 1/00 | (2006.01) |
| B29C 47/00 | (2006.01) |
| C08J 5/18 | (2006.01) |
| H01L 23/373 | (2006.01) |
| C08K 7/06 | (2006.01) |
| C08L 83/04 | (2006.01) |
| C08K 3/22 | (2006.01) |
| C08L 83/14 | (2006.01) |
| B26D 1/08 | (2006.01) |
| B26D 7/08 | (2006.01) |
| B26D 3/28 | (2006.01) |
| C08K 7/18 | (2006.01) |
| B29C 35/02 | (2006.01) |
| B29C 47/10 | (2006.01) |
| B29C 47/88 | (2006.01) |
| B29C 70/62 | (2006.01) |
| B29C 70/14 | (2006.01) |
| C08K 3/04 | (2006.01) |
| C08G 77/12 | (2006.01) |
| C08G 77/20 | (2006.01) |
| C08K 5/56 | (2006.01) |
| B29K 509/00 | (2006.01) |
| B29L 7/00 | (2006.01) |
| B29L 31/18 | (2006.01) |

(52) U.S. Cl.
CPC ............ *B29C 35/02* (2013.01); *B29C 47/1027* (2013.01); *B29C 47/8805* (2013.01); *C08J 5/18* (2013.01); *C08K 3/22* (2013.01); *C08K 7/06* (2013.01); *C08K 7/18* (2013.01); *C08L 83/04* (2013.01); *C08L 83/14* (2013.01); *H01L 23/3737* (2013.01); *B29C 47/0004* (2013.01); *B29C 47/0021* (2013.01); *B29C 47/0066* (2013.01); *B29C 70/14* (2013.01); *B29C 70/62* (2013.01); *B29K 2509/00* (2013.01); *B29K 2883/00* (2013.01); *B29K 2995/0013* (2013.01); *B29K 2995/0044* (2013.01); *B29K 2995/0073* (2013.01); *B29L 2007/00* (2013.01); *B29L 2031/18* (2013.01); *C08G 77/12* (2013.01); *C08G 77/20* (2013.01); *C08J 2383/04* (2013.01); *C08J 2383/05* (2013.01); *C08J 2383/07* (2013.01); *C08K 3/04* (2013.01); *C08K 5/56* (2013.01); *C08K 2003/2227* (2013.01); *C08K 2201/001* (2013.01); *C08K 2201/005* (2013.01); *C08L 2205/025* (2013.01); *H01L 2924/0002* (2013.01); *Y10T 428/24* (2015.01); *Y10T 428/24355* (2015.01); *Y10T 428/24488* (2015.01); *Y10T 428/24777* (2015.01); *Y10T 428/268* (2015.01)

(56) References Cited

U.S. PATENT DOCUMENTS

| | | | |
|---|---|---|---|
| 2003/0194544 | A1* | 10/2003 | Tobita et al. ............... 428/297.7 |
| 2005/0101719 | A1* | 5/2005 | Ishihara ........................ 524/495 |
| 2007/0284366 | A1* | 12/2007 | Ohta ............................. 219/553 |
| 2010/0043610 | A1* | 2/2010 | Tanaka .............................. 83/22 |
| 2010/0200801 | A1 | 8/2010 | Ramasamy et al. |

FOREIGN PATENT DOCUMENTS

| | | |
|---|---|---|
| EP | 1 932 636 A1 | 6/2008 |
| JP | 2002-046137 A | 2/2002 |
| JP | A-2002-46137 | 2/2002 |
| JP | A-2003-200437 | 7/2003 |
| JP | A-2009-55021 | 3/2009 |
| JP | A-2010-50240 | 3/2010 |
| JP | A-2010-56299 | 3/2010 |
| JP | A-2010-515807 | 5/2010 |
| JP | A-2010-260225 | 11/2010 |
| WO | WO 2008 085999 | 7/2008 |
| WO | 2010/024292 A | 3/2010 |

OTHER PUBLICATIONS

May 5, 2015 Office Action issued in U.S. Appl. No. 14/323,313.
Sep. 3, 2015 Office Action issued in U.S. Appl. No. 14/323,313.
Apr. 12, 2016 Office Action issued in European Patent Application No. 11795844.7.

* cited by examiner

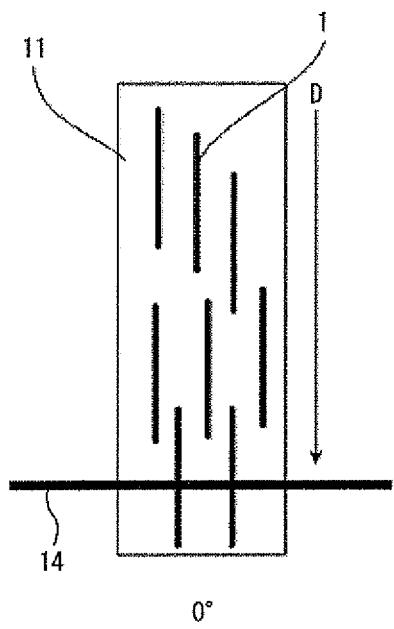
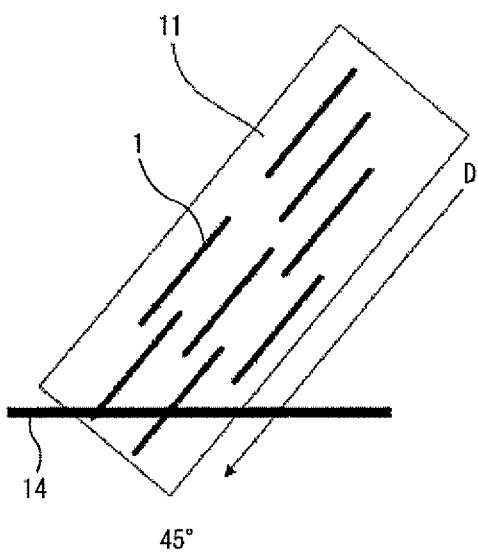
FIG. 9B    FIG. 9A
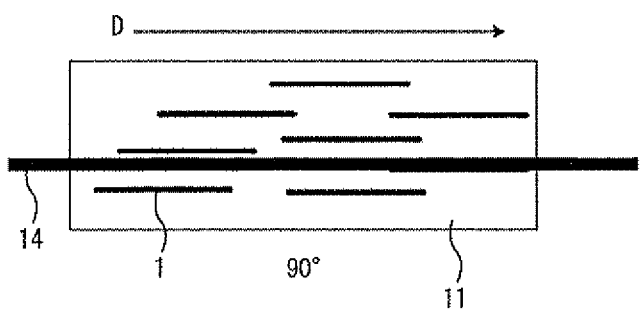
FIG. 9C

| SILICONE RATIO FIRST SILICONE RESIN : SECOND SILICONE RESIN | INITIAL THICKNESS (mm) | THERMAL RESISTANCE (K/W) | COMPRESSION RATE (%) | THERMAL CONDUCTIVITY (W/mK) |
|---|---|---|---|---|
| 50:50 | 0.5 | 0.166 | 4.99 | 9.17 |
| 50:50 | 1.0 | 0.205 | 6.65 | 15.25 |
| 50:50 | 1.5 | 0.234 | 8.86 | 19.84 |
| 50:50 | 2.0 | 0.267 | 9.62 | 23.02 |
| 52:48 | 0.5 | 0.157 | 6.48 | 9.85 |
| 52:48 | 1.0 | 0.164 | 10.49 | 18.41 |
| 52:48 | 1.5 | 0.202 | 14.50 | 22.24 |
| 55:45 | 0.5 | 0.135 | 3.82 | 11.74 |
| 55:45 | 1.0 | 0.146 | 13.21 | 19.05 |
| 55:45 | 1.5 | 0.207 | 30.99 | 15.81 |

FIG. 13

| | ALUMINA 50g (45.8 vol%) CARBON FIBERS 8g (13.3 vol%) | ALUMINA 50g (44.3 vol%) CARBON FIBERS 8g (16.1 vol%) | ALUMINA 50g (42.9 vol%) CARBON FIBERS 8g (18.7 vol%) | ALUMINA 50g (41.6 vol%) CARBON FIBERS 8g (21.2 vol%) | ALUMINA 50g (40.4 vol%) CARBON FIBERS 8g (23.5 vol%) | ALUMINA 50g (39.2 vol%) CARBON FIBERS 8g (25.7 vol%) |
|---|---|---|---|---|---|---|
| 1mm | NG | NG | CORRESPONDING TO V1 | CORRESPONDING TO V0 | CORRESPONDING TO V0 | — |
| 2mm | CORRESPONDING TO V0 | CORRESPONDING TO V0 | CORRESPONDING TO V0 | CORRESPONDING TO V0 | CORRESPONDING TO V0 | — |
| EASINESS IN EXTRUSION | ◎ | ◎ | ○ | ○ | △ | × |

FIG. 14

| MATERIAL NAME | WEIGHT | WEIGHT RATIO |
|---|---|---|
| FIRST SILICONE RESIN | 5.4g | 7.219% |
| SECOND SILICONE RESIN | 5.4g | 7.219% |
| PITCH-BASED CARBON FIBERS R-A301 (TEIJIN) | 14g | 18.7166% |
| ALUMINA DAW03 (DENKA) | 50g | 66.8449% |

| SHEET THICKNESS \ SLICE RATE | 100mm/s | 50mm/s | 10mm/s | 1mm/s |
|---|---|---|---|---|
| 0.50mm | □ | □ | □ | □ |
| 0.30mm | □ | □ | □ | □ |
| 0.25mm | □ | □ | □ | □ |
| 0.20mm | □ | □ | □ | □ |
| 0.15mm | □ | □ | □ | □ |
| 0.10mm | □ | □ | □ | □ |
| 0.05mm | ◠ | ◰ | ◡ | ◳ |

FIG. 20

| SLICE RATE / SHEET THICKNESS | 100mm/s | 50mm/s | 10mm/s | 1mm/s |
|---|---|---|---|---|
| 0.50mm | 0.521mm<br>14.51W/mK<br>0.112K/W<br>2.18% | 0.531mm<br>12.93W/mK<br>0.124K/W<br>5.49% | 0.483mm<br>10.45W/mK<br>0.138K/W<br>6.09% | 0.531mm<br>13.84W/mK<br>0.114K/W<br>6.54% |
| 0.30mm | 0.333mm<br>7.46W/mK<br>0.137K/W<br>3.72% | 0.377mm<br>8.07W/mK<br>0.118K/W<br>11.21% | 0.338mm<br>8.98W/mK<br>0.106K/W<br>11.77% | 0.340mm<br>9.33W/mK<br>0.103K/W<br>11.38% |
| 0.25mm | 0.290mm<br>7.17W/mK<br>0.112K/W<br>13.31% | 0.272mm<br>7.05W/mK<br>0.107K/W<br>13.20% | 0.277mm<br>5.59W/mK<br>0.149K/W<br>5.42% | 0.278mm<br>5.11W/mK<br>0.151K/W<br>12.57% |
| 0.20mm | 0.191mm<br>3.71W/mK<br>0.139K/W<br>15.33% | 0.203mm<br>3.99W/mK<br>0.139K/W<br>14.11% | 0.208mm<br>4.37W/mK<br>0.119K/W<br>21.42% | 0.205mm<br>4.01W/mK<br>0.139K/W<br>14.45% |

FIG. 21

| AMPLITUDE | 50 $\mu$m | 60 $\mu$m | 70 $\mu$m |
|---|---|---|---|
| INITIAL THICKNESS | 0.816mm | 0.811mm | 0.806mm |
| THERMAL RESISTANCE | 0.221K/W | 0.227K/W | 0.214K/W |
| THERMAL CONDUCTIVITY | 11.29W/mK | 11.02W/mK | 11.72W/mK |
| COMPRESSION RATE | 3.84% | 3.29% | 2.18% |

FIG. 22

THERMALLY CONDUCTIVE SHEET AND PROCESS FOR PRODUCING SAME

FIELD OF THE INVENTION

This invention relates to a thermally conductive sheet and a process for producing such a thermally conductive sheet. This application is a division of U.S. patent application Ser. No. 13/702,438, filed Feb. 8, 2013 (now U.S. Pat. No. 8,808, 607), which asserts priority rights based on JP Patent Application 2010-138334 and JP Patent Application 2010-138417 filed in Japan on Jun. 17, 2010, as well as JP Patent Application 2011-79976 filed in Japan on Mar. 31, 2011. The total contents of disclosure of the Patent Applications of the senior filing date are to be incorporated by reference into the present Application.

BACKGROUND OF THE INVENTION

Along with higher performances achieved in electronic apparatuses, semiconductor elements with a higher density and highly packaged semiconductor elements have been developed. In response to this trend, it becomes essential to more efficiently radiate heat generated from electronic parts forming electronic apparatuses. In order to allow the semiconductor to radiate heat efficiently, the semiconductor is attached to a heat sink, such as a heat radiating fin, a heat radiating plate, or the like, with a thermally conductive sheet interpolated therebetween. As the thermally conductive sheet, such a sheet that is made of silicone with a filler (thermally conductive filler), such as an inorganic filler, contained and dispersed therein has been widely used.

In this heat radiating member, further improvement of a thermal conductivity is demanded, and in general, a filling rate of inorganic filler blended in a matrix is increased so as to achieve a high thermal conductivity. However, when the filling rate of the inorganic filler is increased, the flexibility is lowered, or spilled powder might occur because of the high filling rate of the inorganic filler, this method for increasing the filling rate of an inorganic filler has a limitation.

As the above-mentioned inorganic filler, for example, alumina, aluminum nitride, aluminum hydroxide, etc. are proposed. Moreover, in some cases, in order to obtain a higher heat conductivity, boron nitride (BN), scale-shaped particles, such as graphite, carbon fibers, etc. are filled into a matrix. In this case, the anisotropic property of thermal conductivity possessed by the scale-shaped particles, etc. is utilized. For example, carbon fibers have a thermal conductivity of about 600 W/m·K to 1200 W/m·K in the fiber direction. It has been known that the anisotropic property of boron nitride is such that a thermal conductivity of about 110 W/m·K is exerted in the plane direction and a thermal conductivity of about 2 W/m·K is exerted in a direction perpendicular to the plane direction.

In this manner, the plane direction of carbon fibers or scale-shaped particles is made to be the same as the thickness direction of the sheet that is a heat transmitting direction. That is, by orienting the carbon fibers or the scale-shaped particles in the thickness direction of the sheet, it becomes possible to remarkably improve the thermal conductivity. However, in the case when, after having been molded, a cured object having been subjected to a curing process is sliced into a desired thickness, since the cured object having flexibility is sliced while being deformed, concave/convex portions on the sheet surface become greater, with air being involved into the concave/convex portions, resulting in a problem of failing to effectively utilize its superior thermal conductivity.

In order to solve the above-mentioned problem, for example, Patent Literature 1 has proposed a thermally conductive rubber sheet that is formed by being punched out with blades that are aligned in a direction perpendicular to the sheet longitudinal direction with equal intervals, and then sliced. Moreover, Patent Literature 2 has proposed a method in which a laminated member, formed by stacking layers while repeatedly carrying out coating and curing processes, is sliced with a cutting device with a round rotary blade so that a thermally conductive sheet with a predetermined thickness is obtained. Furthermore, Patent Literature 3 has proposed a method in which a laminated member, formed by stacking two or more graphite layers containing anisotropic graphite particles, is cut with a metal saw so as to be oriented with 0° relative to the thickness direction of the sheet so as to obtain an expanded graphite sheet (with an angle of 90° relative to the stacked layer surface).

In these proposed cutting methods, however, since the surface roughness on a cut surface becomes higher, a greater thermal resistance is caused on the interface, resulting in a problem of a reduction in thermal conductivity in the thickness direction.

Therefore, under these circumstances, there have been strong demands for providing a thermally conductive sheet that has a reduced thermal resistance because of its small surface roughness on a cut surface with a high thermal conductivity in the thickness direction, and is suitable for use as a member to be interposed between any of various heat sources (for example, various devices, such as a CPU, a transistor, and an LED) and a heat radiating member, and a method of producing such a thermally conductive sheet.

PRIOR-ART DOCUMENTS

Patent Document

PTL 1: Japanese Patent Application Laid-Open No. 2010-56299

PTL 2: Japanese Patent Application Laid-Open No. 2010-50240

PTL 3: Japanese Patent Application Laid-Open No. 2009-55021

SUMMARY OF THE INVENTION

The present invention has been devised to solve the above-mentioned conventional problems and aims to achieve the following object. That is, the object of the present invention is to provide a thermally conductive sheet in which because of its small surface roughness on a cut surface, the thermal resistance on the interface is reduced, and because of its high thermal conductivity in the thickness direction, it is suitable for use as a member to be interposed between any of various heat sources and a heat radiating member, and a method of producing such a thermally conductive sheet.

In order to solve the above-mentioned problems, the present inventors have intensively carried out various researches and have reached the following findings. That is, by allowing a thermally conductive composition containing an anisotropic thermally conductive filler and a filler to pass through a plurality of slits, the anisotropic thermally conductive filler blended in the thermally conductive composition is oriented in the thickness direction of the thermally conductive sheet, and molded without disturbing the oriented state of the anisotropic thermally conductive filler, and then extrusion-molded through a mold outlet as a block body. After the resulting molded product has been cured, the cured object is cut in a direction perpendicular to the extrusion direction by using an ultrasonic cutter into a given thickness; thus, it has been found that since cut surfaces with low surface roughness are obtained, reduced thermal resistance is obtained on the interfaces so that it is possible to obtain a thermally conductive sheet having high thermal conductivity in the thickness direction, which is suitable for use as a member to be interposed between any of various heat sources (for example, various devices, such as a CPU, a transistor, and an LED) and a heat radiating member.

Moreover, it is also found that, upon cutting the cured object of the thermally conductive composition into a given thickness with the ultrasonic cutter, by slicing the cured object, with the cured object (thermally conductive sheet) to be cut with the ultrasonic cutter being disposed so that the anisotropic thermally conductive filler is oriented with an angle of 5° to 45° relative to the thickness direction of the cured object to be cut with the ultrasonic cutter, the applied angle allows the anisotropic thermally conductive filler to easily fall when the sheet is pasted between semiconductor elements and a heat sink with a load being applied thereto (the anisotropic thermally conductive filler is easily allowed to slide within the thermally conductive sheet), thereby making it possible to improve a compression rate while suppressing an increase in thermal resistance.

The present invention has been devised based upon the findings by the present inventors, and the following arrangements are prepared as the means for solving the above-mentioned problems.

<1> A method for producing a thermally conductive sheet characterized by including at least an extrusion molding step of: by extruding a thermally conductive composition containing a polymer, an anisotropic thermally conductive filler and a filler through an extruder, extrusion molding an extrusion molded product in which the anisotropic thermally conductive filler is oriented along the extrusion direction;

a curing step of curing the extrusion molded product to form a cured object; and a cutting step of cutting the cured object in a direction perpendicular to the extrusion direction into a given thickness with an ultrasonic cutter.

<2> A method for producing a thermally conductive sheet characterized by including at least an extrusion molding step of: by extruding a thermally conductive composition containing a polymer, an anisotropic thermally conductive filler and a filler through an extruder, extrusion-molding an extrusion molded product in which the anisotropic thermally conductive filler is oriented along the extrusion direction;

a curing step of curing the extrusion molded product to form a cured object; and a cutting step in which upon cutting the cured object into a given thickness with an ultrasonic cutter, a slicing process is carried out on the cured object, with the cured object being disposed so that the anisotropic thermally conductive filler is oriented with an angle of 5° to 45° relative to the thickness direction of the cured object to be cut with the ultrasonic cutter.

<3> The method for producing a thermally conductive sheet described in either <1> or <2> in which the anisotropic thermally conductive filler has an average fiber length of 100 μm or more.

<4> The method for producing a thermally conductive sheet described in any one of <1> to <3> in which the anisotropic thermally conductive filler is prepared as carbon fibers.

<5> The method for producing a thermally conductive sheet described in any one of <1> to <4> in which the anisotropic thermally conductive filler has a content of 16% by volume to 25% by volume in the thermally conductive composition.

<6> The method for producing a thermally conductive sheet described in any one of <1> to <5> in which the filler has an average particle size in a range from 1 μm to 40 μm.

<7> The method for producing a thermally conductive sheet described in any one of <1> to <6> in which the filler is prepared as spherical alumina particles.

<8> The method for producing a thermally conductive sheet described in any one of <1> to <7> in which the polymer is a silicone resin.

<9> A thermally conductive sheet produced by the method for producing a thermally conductive sheet described in any one of <1> to <8>.

<10> The thermally conductive sheet described in <9> in which a peripheral portion of the thermally conductive sheet has a slight stickiness that is higher than that of the inside of the thermally conductive sheet.

<11> The thermally conductive sheet described in <9> or <10> in which the thermally conductive sheet has a cut surface having a surface roughness Ra of 9.9 μm or less.

Effects of Invention

The present invention makes it possible to solve the above-mentioned various conventional problems, and also to achieve the above-mentioned object, and since cut surfaces with low surface roughness are obtained, reduced thermal resistance is obtained on the interfaces so that it is possible to obtain a thermally conductive sheet having high thermal conductivity in the thickness direction, which is suitable for use as a member to be interposed between any of various heat sources and a heat radiating member, and a method for producing such a thermally conductive sheet.

BRIEF DESCRIPTION OF DRAWING

FIGS. 9A, 9B and 9C are views for use in explaining angles to be formed between an extrusion direction (length direction) of a cured object and a blade of the ultrasonic cutter; FIG. 9A shows 45°, FIG. 9B shows 0° and FIG. 9C shows 90°.

FIG. 13 is a table showing a compression rate of each of a first silicone resin and a second silicone resin relative to their compounding ratio.

FIG. 14 is a table showing evaluations carried out on a burning test and easiness in extrusion of a sheet base material.

FIG. 20 is a view that shows a slicing speed of an ultrasonic cutter and a shape of the thermally conductive sheet in association with the thickness thereof.

FIG. 21 is a table that shows a slicing speed of the sheet base material and characteristics of the thermally conductive sheet, which depend on a difference in thickness of the thermally conductive sheet.

FIG. 22 is a table that shows respective characteristics of thermally conductive sheets that are sliced with the amplitude of ultrasonic vibrations to be applied to the cutter being changed.

DETAILED DESCRIPTION OF THE INVENTION (Thermally Conductive Sheet and Production Method of Thermally Conductive Sheet)

The producing method of a thermally conductive sheet of the present invention includes at least an extrusion molding process, a curing process and a cutting process, and also includes other processes, if necessary.

The thermally conductive sheet of the present invention is produced by the production method of the thermally conductive sheet of the present invention.

While giving an explanation of the producing method for the thermally conductive sheet of the present invention, the thermally conductive sheet of the present invention will also be clearly described in detail.

Figure 1:
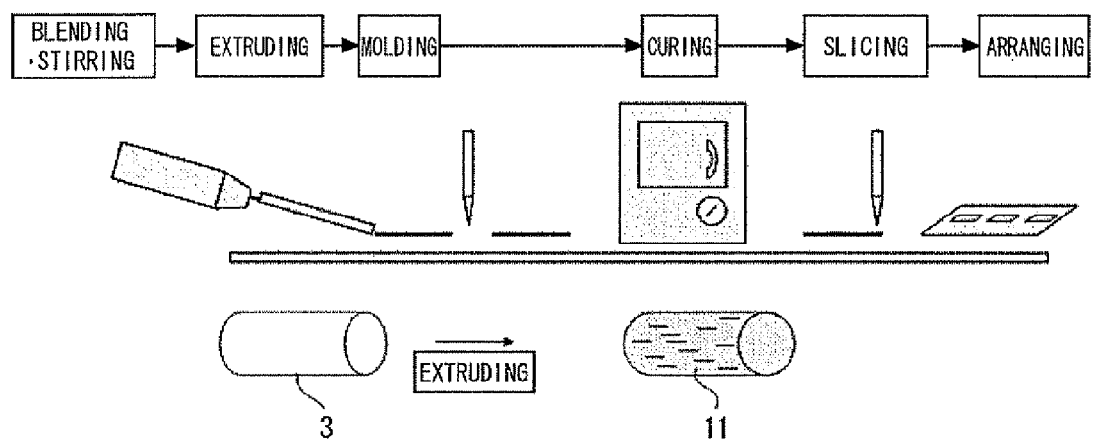
FIG. 1 is a schematic diagram that shows a flow of a producing method for a thermal conductive sheet of the present invention.

As shown in FIG. 1, in accordance with the producing method, the thermally conductive sheet of the present invention is produced through a series of processes including an extruding process, a molding process, a curing process, a cutting (slicing) process and the like.

First, as shown in FIG. 1, a thermally conductive composition containing a polymer, an anisotropic thermally conductive filler and a filler is prepared. Next, when the thermally conductive composition thus prepared is extruded and molded, by allowing the composition to pass through a plurality of slits, the anisotropic thermally conductive filler blended in the thermally conductive composition is oriented in the thickness direction of the thermally conductive sheet. After the resulting molded product has been cured, the cured object 11 is cut in a direction perpendicular to the extrusion direction by using an ultrasonic cutter into a given thickness; thus, since cut surfaces with low surface roughness are obtained, reduced thermal resistance is obtained on the interfaces so that it is possible to produce a thermally conductive sheet having high thermal conductivity in the thickness direction.

Moreover, as shown in FIG. 9, a cured object 11 obtained by curing the resulting molded product is disposed so as to allow the extrusion direction D of the cured object 11 to have a predetermined angle with the blade of an ultrasonic cutter 14 (45° in FIG. 9A, 0° in FIG. 9B and 90° in FIG. 9C) and is cut so as to have a given thickness so that when pasted to be interpolated between the semiconductor element and the heat sink with a load applied thereto, by the angle prepared thereto, the anisotropic thermally conductive filler 1 is allowed to easily fall (the anisotropic thermally conductive filler is allowed to easily slide within the thermally conductive sheet); thus, it is possible to form a thermally conductive film having an improved compression rate while suppressing an increase in thermal resistance. In this case, the angle made by the extrusion direction D (length direction) of the cured object 11 and the blade of the ultrasonic cutter 14 is the same as the oriented angle of the anisotropic thermally conductive filler 1 relative to the thickness direction of the thermally conductive sheet.

<Extrusion Molding Process>

The above-mentioned extrusion molding process is a process in which a thermally conductive composition containing a polymer, an anisotropic thermally conductive filler and a filler is extruded by an extruder so that an extrusion molded product in which the anisotropic thermally conductive filler is oriented along the extrusion direction is produced.

—Polymer—

As the above-mentioned polymer, not particularly limited, any polymer may be selected on demand in accordance with performances required for the thermally conductive sheet, and for example, a thermoplastic polymer or a thermosetting polymer may be used.

As the thermoplastic polymer, a thermoplastic resin, a thermoplastic elastomer or a polymer alloy formed by these may be used.

As the thermoplastic resin, not particularly limited, any resin may be selected on demand in accordance with objectives thereof, and examples thereof include: an ethylene-α-olefin copolymer, such as polyethylene, polypropylene and an ethylene-propylene copolymer; fluorine-based resins, such as polymethyl pentene, polyvinyl chloride, polyvinylidene chloride, polyvinyl acetate, ethylene-vinylacetate copolymer, polyvinyl alcohol, polyacetal, polyvinylidene fluoride, polytetrafluoroethylene, etc.; polyethylene terephthalate, polybutylene terephthalate, polyethylene naphthalate, polystyrene, polyacrylonitrile, a styrene-acrylonitrile copolymer, an acrylonitrile-butadiene-styrene copolymer (ABS) resin, polyphenylene ether, modified polyphenylene ether, aliphatic polyamides, aromatic polyamides, polyamideimide, polymethacrylic acid or esters thereof, polyacrylic acid or esters thereof, polycarbonate, polyphenylene sulfide, polysulfone, polyether sulfone, polyether nitrile, polyether ketone, polyketone, liquid crystal polymer, silicone resin, ionomer, etc. One of these may be used alone, or two or more kinds of these may be used in combination.

Examples of the above-mentioned thermoplastic elastomer include styrene-based thermoplastic elastomers, such as a styrene-butadiene copolymer or a hydrogenated polymer thereof, a styrene-isoprene block copolymer or a hydrogenated polymer thereof, olefin-based thermoplastic elastomers, vinylchloride-based thermoplastic elastomers, polyester-based thermoplastic elastomers, polyurethane-based thermoplastic elastomers, polyamide-based thermoplastic elastomers, etc. One kind of these may be used alone, or two or more kinds of these may be used in combination.

Examples of the thermosetting polymer include: cross-linking rubbers, epoxy resins, polyimide resins, bismaleimide resins, benzocyclobutene resins, phenol resins, unsaturated polyesters, diallyl phthalate resins, silicone resins, polyurethane, polyimide silicone, thermosetting polyphenylene ether, thermosetting denatured polyphenylene ether, etc. One of these may be used alone, or two or more kinds of these may be used in combination.

Examples of the above-mentioned cross-linking rubbers include: natural rubbers, butadiene rubbers, isoprene rubbers, nitrile rubbers, hydrogenated nitrile rubbers, chloroprene rubbers, ethylene propylene rubbers, chlorinated polyethylene, chlorosulfonated polyethylene, butyl rubbers, halogenated butyl rubbers, fluorine rubbers, urethane rubbers, acrylic rubbers, polyisobutylene rubbers, silicone rubbers, etc. One of these may be used alone, or two or more kinds of these may be used in combination.

Among these, the silicone resins are in particular preferably used because of their superior molding processability and weatherability as well as from the viewpoints of good adhesion and follow-up property to electronic parts.

The above-mentioned silicone resin is not particularly limited, but is desirably selected depending on its purposes, and examples thereof include: addition reaction type liquid silicone rubbers, silicone rubbers of a thermal vulcanization millable type using peroxide for vulcanizing process thereof, etc. Among these, since adhesion between a heat radiating surface and a heat sink surface of an electronic part is required as the heat radiating member of an electronic apparatus, addition reaction type liquid silicone rubbers are in particular preferably used.

—Anisotropic Thermally Conductive Filler—

With respect to the shape of the anisotropic thermally conductive filler, not particularly limited, selection can be made on demand depending on purposes, and examples thereof include: a scale shape, a plate shape, a column shape, a rectangular pillar shape, an elliptical shape, a flattened shape, etc. Among these, from the viewpoint of anisotropic thermal conductivity, the flattened shape is preferably used, in particular.

With respect to the above-mentioned filler having an anisotropic property, for example, boron nitride (BN) powder, graphite, carbon fibers are proposed. Among these, from the viewpoint of anisotropic thermal conductivity, carbon fibers are more preferably used.

With respect to the carbon fibers, for example, pitch-based carbon fibers, PAN-based carbon fibers, and those carbon fibers synthesized by using an arc discharge method, a laser evaporation method, a CVD method (Chemical Vapor Deposition Method), a CCVD method (Catalyst Chemical Vapor Deposition Method) and the like may be used. Among these, in particular, the pitch-based carbon fibers are preferably used from the viewpoint of thermal conductivity.

One portion or the entire portion of the carbon fibers may be subjected to a surface treatment, if necessary, and then used. As the surface treatment, for example, an oxidizing treatment, a nitriding treatment, a nitrating treatment, sulfonating treatment, or a treatment in which on the surface of a functional group introduced thereon by these treatments or carbon fibers, a metal, a metal compound, an organic compound or the like is adhered or combined may be used. As the above-mentioned functional group, for example, a hydroxyl group, a carboxyl group, a carbonyl group, a nitro group, an amino group, or the like can be proposed.

The average major axis length (average fiber length) of the above-mentioned carbon fibers is preferably set to 100 µm or more, more preferably to 120 µm to 6 mm. In the case when the average major axis length is less than 100 µm, it is not possible to obtain a sufficient anisotropic thermal conductivity in some cases, with the result that a high thermal resistance is caused.

The average minor axis length of the above-mentioned carbon fibers is preferably set to 6 µm to 15 µm, more preferably to 8 µm to 13 µm.

The aspect ratio of the above-mentioned carbon fibers (average major axis length/average minor axis length) is preferably set to 8 or more, more preferably, to 12 to 30. In the case when the aspect ratio is less than 8, the thermal conductivity tends to be lowered because of the short fiber length (major axis length) of the carbon fibers.

In this case, the average major axis length and the average minor axis length of the carbon fibers can be measured by using, for example, a microscope, a scanning electron microscope (SEM), or the like.

The content of the anisotropic thermal conductive filler in the above-mentioned thermal conductive composition is preferably set to 15% by volume to 26% by volume. In the case of the content of less than 15% by volume, it is sometimes not possible to provide a sufficient thermal conductivity to the molded product, while in the case of the content exceeding 26% by volume, adverse effects are sometimes given to the moldability and the orientation property.

—Filler—

With respect to the above-mentioned filler, the shape, material, average grain size, etc. thereof are not particularly limited, but can be selected on demand depending on purposes thereof. With respect to the shape, although not particularly limited, selection can be made on demand depending on purposes thereof, and for example, a spherical shape, an elliptic spherical shape, a blocky shape, a grain shape, a flattened shape, a needle shape, etc. may be used. Among these, from the viewpoint of filling property, the spherical shape and the elliptic spherical shape are preferably used, and the spherical shape is in particular more preferably used.

With respect to the material for the filler, examples thereof include: aluminum nitride, silica, alumina, boron nitride, titania, glass, zinc oxide, silicon carbide, silicon, silicon oxide, aluminum oxide, metal particles, etc. One kind of these may be used alone, or two or more kinds of these may be used in combination. Among these, alumina, boron nitride, aluminum nitride, zinc oxide and silica are preferably used, and from the viewpoint of thermal conductivity, alumina and aluminum nitride are in particular preferably used.

In this case, the above-mentioned filler may be subjected to a surface treatment. When the surface treatment is carried out with a coupling agent, the dispersibility is improved, and the flexibility of the thermally conductive sheet is improved. Moreover, the surface roughness derived from the slicing can be made smaller.

The average particle size of the filler is preferably set to 1 µm to 40 µm, more preferably, to 1 µm to 20 µm. The average particle size of less than 1 µm might cause an insufficient curing process, and the average particle size exceeding 40 µm sometimes disturbs the orientation of carbon fibers to cause a reduction in the thermal conductivity of the cured object.

The average particle size of the filler can be measured by using, for example, a grain size distribution meter and a scanning electron microscope (SEM).

The content of the filler in the above-mentioned thermally conductive composition is preferably set to 40% by volume to 60% by volume.

To the above-mentioned thermally conductive composition, if necessary, other components, such as a solvent, a thixotropy-adding agent, a dispersant, a curing agent, a curing accelerator, a retarding agent, a fine tackifier, a plasticizer, a flame retardant, an antioxidant, a stabilizer, a colorant and the like, may be further added to be blended therein.

The above-mentioned thermally conductive composition can be prepared by mixing the polymer, the anisotropic thermally conductive filler and the filler, as well as the other components, if necessary, with one another by using a mixer or the like.

Next, the thermally conductive composition is extruded into a mold 3 by using a pump, an extruder or the like to be molded therein (see FIG. 1). A plurality of slits are formed on the extrusion outlet of the extruder so that the anisotropic thermally conductive filler is subsequently oriented in the extrusion direction.

The shape and size of the slits are not particularly limited, and selection may be made depending on purposes thereof, and for example, a flat plate shape, a lattice shape, a honeycomb shape and the like are proposed as the shape of the slits. As the size (width) of the slits, that in a range from 0.5 mm to 10 mm is preferably used.

The extruding rate of the thermally conductive composition is preferably set to 0.001 L/min.

With respect to the mold 3, the shape, size, material and the like are not particularly limited, and selection is made on demand depending on purposes thereof; as the shape, for example, a hollow column shape, a hollow rectangular pillar shape and the like are proposed. The size can be selected on demand in accordance with the size of the thermally conductive sheet to be produced. As the material, for example, stainless is proposed.

During a process in which the thermally conductive composition is allowed to pass through the extruder or the like, the anisotropic thermally conductive filler, the filler, etc. are collected in the central direction of the thermally conductive composition so that the anisotropic thermally conductive filler and the filler have different densities between the surface and the central portion. That is, since on the surface of the thermally conductive composition (molded product) that has passed through the extruder, none of the thermally conductive filler and anisotropic thermally conductive filler protrude onto the surface, the surface portion (outer circumferential portion of the thermally conductive sheet) of the cured object 11 formed by curing the thermally conductive composition (molded product) has a preferable slight stickiness so that a preferable adhesive property to an adhesion object (a semiconductor device or the like) is exerted. In contrast, on the surface to be made in contact with a heat source or a heat radiating side, since the anisotropic thermally conductive filler is protruded therefrom, its slight stickiness is lowered.

Figure 2:
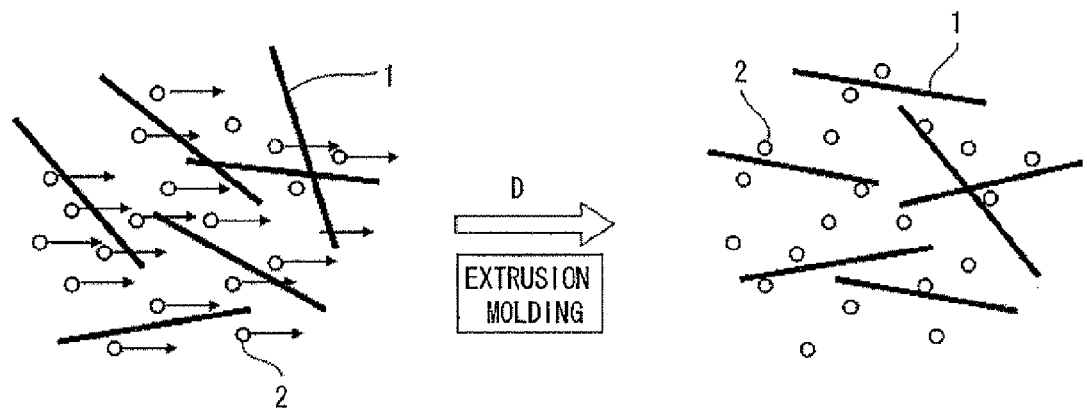
FIG. 2 is an explanatory view that explains an oriented state of an anisotropic thermal conductive filler in an extrusion molding process.

Moreover, as shown in FIG. 2, by extrusion molding the anisotropic thermally conductive filler 1 and the thermally conductive composition containing the spherical filler 2, the fiber-state anisotropic thermally conductive filler 1 can be oriented in the extrusion direction.

In this case, the slight stickiness refers to such a characteristic as to have a re-peeling property that is less susceptible to an increase in adhesive strength with the lapse of time and due to wet heat and also to have a stickiness in such a degree that when pasted onto the adhesion object, a positional deviation is not easily caused.

<Curing Process>

The above-mentioned curing process is a process by which the above-mentioned extrusion molded product is cured to form a cured object.

The molded product molded in the above-mentioned extrusion molding process is formed into a complete cured object through a curing reaction appropriately adjusted depending on a resin to be used.

With respect to the curing methods of the extrusion molded product, not particularly limited, selection is made on demand depending on purposes thereof, and in the case when a thermosetting resin such as a silicone resin is used as a polymer, the curing process is preferably carried out by heating.

As the device for use in the above heating process, for example, a far infrared furnace, a hot air furnace, etc. are proposed.

With respect to the heating temperature, not particularly limited, selection may be made on demand depending on purposes thereof, and for example, a temperature range of 40° C. to 150° C. is preferably used.

With respect to the flexibility of the silicone cured object formed by curing the silicone resin, not particularly limited, selection is made on demand depending on purposes thereof, and it can be adjusted, for example, by the crosslinking density of the silicone, the filling amount of the thermally conductive filler, etc.

<Cutting Process>

In a first mode, the cutting process is a process in which the cured object is cut by using an ultrasonic cutter in a direction perpendicular to the extrusion direction into a given thickness.

In a second mode, the cutting process is a process in which, upon cutting the cured object into a given thickness by using an ultrasonic cutter, the cured object is disposed so as to allow the anisotropic thermally conductive filler to be oriented with an angle from 5° to 45° relative to the thickness direction of the cured object to be cut by the ultrasonic cutter, and then cut.

Additionally, the ultrasonic cutter is secured so that the position of the blade of the ultrasonic cutter is unchanged.

The angle made by the thickness direction of the cured object (thermally conductive sheet) to be cut into a given thickness with the ultrasonic cutter and the anisotropic thermally conductive filler is preferably set to 5° to 45°, more preferably to 5° to 30°. In the case when the angle thus made is less than 5°, the compression rate is unchanged from that at the time of 0°, while in the case when it exceeds 45°, the thermal resistance value is sometimes increased.

The angle thus made can be measured by using, for example, an electron microscope.

The cutting process is carried out by using the ultrasonic cutter. In the ultrasonic cutter, the transmission frequency and the amplitude can be adjusted, and the transmission frequency is preferably adjusted in a range from 10 kHz to 100 kHz, and the amplitude is preferably adjusted in a range from 10 μm to 100 μm. In the case when the cutting process is carried out by using not the ultrasonic cutter, but a cutter knife or a meat slicer (rotary blade), the surface roughness Ra on the cut surface becomes larger to cause an increased thermal resistance.

In accordance with the cutting process in the first mode, by cutting the cured object in which the curing reaction has been completed in a direction perpendicular to the extrusion direction into a given thickness by using the ultrasonic cutter, it becomes possible to obtain a thermally conductive sheet in which the anisotropic thermally conductive filler (for example, carbon fibers, or scale shaped particles) is oriented in the thickness direction (perpendicularly oriented) of the thermally conductive sheet.

In accordance with the cutting process in the second mode, upon cutting the cured object into a given thickness by using the ultrasonic cutter, the cured object is disposed so as to allow the anisotropic thermally conductive filler to be oriented with an angle from 5° to 45° relative to the thickness direction of the cured object to be cut by the ultrasonic cutter (thermally conductive sheet), and then cut; thus, the anisotropic thermally conductive filler inside the thermally conductive sheet is allowed to easily fall (the anisotropic thermally conductive filler is allowed to easily slide within the thermally conductive sheet); thus, it is possible to improve a compression rate while suppressing an increase in thermal resistance.

The thickness of the thermally conductive sheet is preferably set to 0.1 mm or more. When the thickness is less than 0.1 mm, the sheet sometimes fails to retain its shape when being sliced, depending on the hardness of the cured object. There is a limitation in a method for orienting the anisotropic thermally conductive filler by applying a magnetic field to a thick sheet; however, the producing method of the thermally conductive sheet of the present invention is advantageous in that no limitation is given to the thickness of the sheet.

With respect to the thermally conductive sheet of the present invention, the oriented angle of the anisotropic thermally conductive filler (for example, carbon fibers, or scale shaped particles) relative to the thickness direction of the thermally conductive sheet is preferably set to 0 degree to 45 degrees, more preferably, to 0 degree to 30 degrees.

The oriented angle of the carbon fibers can be measured by, for example, observing the cross section of the thermally conductive sheet with a microscope.

With respect to the thermally conductive sheet produced by the producing method of the thermally conductive sheet of the present invention, the surface roughness Ra of the cut surface after the cutting process is preferably set to 9.9 μm or less, more preferably, to 9.5 μm or less. In the case when the surface roughness Ra exceeds 9.9 μm, the subsequent increased surface roughness tends to cause a greater thermal resistance.

The above-mentioned surface roughness Ra can be measured by using, for example, a laser microscope.

Since the thermally conductive sheet of the present invention is used as a member to be interposed between any of various heat sources (for example, various devices, such as a CPU, a transistor and an LED) and a heat radiating member, it is preferably provided with a flame retardant property from the viewpoint of safety, and the flame retardant property is preferably set to "V-0" or more according to UL-94 standard.

—Application—

Since the thermally conductive sheet of the present invention has a small surface roughness on a cut surface and a reduced thermal resistance on the interfaces with a high thermal conductivity in the thickness direction, it is suitable for use as a member to be interposed between any of various heat sources (for example, various devices, such as a CPU, a transistor and an LED) and a heat radiating member; thus, it can be desirably applied to peripheral parts of various electric devices, such as, for example, a CPU, an MPU, a power transistor, an LED, a laser diode, various batteries (various secondary batteries, such as lithium ion batteries, various fuel batteries, and various solar batteries, such as wet-type solar batteries, including capacitors, amorphous silicon, crystal silicon, compound semiconductors, etc.), which are adversely influenced in efficiency of element operations, service life, etc., depending on, for example, temperatures; and the peripheral parts of heat sources of heating apparatuses and the peripheral parts of heating pipes of heat exchangers and floor heating apparatuses in which heat needs to be effectively utilized.

EXAMPLES

The following description will discuss examples of the present invention; however, the present invention is not intended to be limited by these examples.

In the following examples and comparative examples, the average particle diameters of alumina particles and aluminum nitride particles are values measured by using a grain size distribution meter. Moreover, the average major axis length and the average minor axis length of pitch-based carbon fibers are values measured by a microscope (KH7700, made by HiROX Co., Ltd.).

Example 1

Production of Thermally Conductive Sheet

To an addition reaction-type liquid-state silicone resin of a two-liquid type prepared by mixing 18.8% by volume of a silicone A liquid (organopolysiloxane having a vinyl group) and 18.8% by volume of a silicone B liquid (organopolysiloxane having an H—Si group) were added to be dispersed therein alumina particles (average particle size: 3 μm, Alumina DAW03, spherical shape, made by Denki Kagaku Kogyo Kabushiki Kaisha)(42.3% by volume) and pitch-based carbon fibers (average major axis length: 150 μm, average minor axis length: 8 μm, Raheama R-A301, made by Teijin Ltd.) (20.1% by volume) so that a silicone resin composition was prepared.

The resulting silicone resin composition was extrusion-molded into a mold 3 (hollow column shape) by using an extruder so that a silicone molded product was formed. A slit (extrusion outlet shape: flat plate) was formed on the extrusion outlet of the extruder.

The resulting silicone molded product was heated at 100° C. for 1 hour in an oven so that a silicone cured object was prepared.

Figure 3:
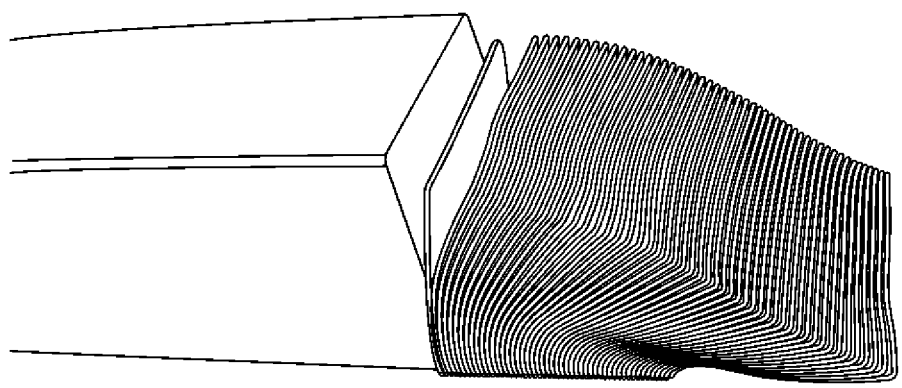
FIG. 3 is a photograph that shows a state in which a silicone cured object of embodiment 1 is cut with an ultrasonic cutter.

The resulting silicone cured object was cut into slices by an ultrasonic cutter so as to have a thickness of 0.5 mm (see FIG. 3, transmission frequency: 20.5 kHz, amplitude: 50 to 70 μm). As described above, a thermally conductive sheet of example 1 having a square shape of 15 mm in longitudinal length and 15 mm in lateral length with a thickness of 0.5 mm was prepared.

When the cross section of the resulting thermally conductive sheet was observed with a microscope (KH7700, made by HiROX Co., Ltd.), the pitch-based carbon fibers were oriented with an angle of 0 degree to 5 degrees relative to the thickness direction of the thermally conductive sheet.

Example 2

Production of Thermally Conductive Sheet

The same processes as those of example 1 were carried out except that in example 1, the alumina particles (average particle size: 3 μm, Alumina DAW03, spherical shape, made by Denki Kagaku Kogyo Kabushiki Kaisha) were changed to alumina particles (average particle size: 5 μm, Alumina DAW05, spherical shape, made by Denki Kagaku Kogyo Kabushiki Kaisha) so that a thermally conductive sheet of example 2 having a square shape of 15 mm in longitudinal length and 15 mm in lateral length with a thickness of 0.5 mm was formed.

Example 3

Production of Thermally Conductive Sheet

The same processes as those of example 1 were carried out except that in example 1, the alumina particles (average particle size: 3 μm, Alumina DAW03, spherical shape, made by Denki Kagaku Kogyo Kabushiki Kaisha) were changed to alumina particles (average particle size: 10 μm, Alumina DAW10, spherical shape, made by Denki Kagaku Kogyo Kabushiki Kaisha) so that a thermally conductive sheet of example 3 having a square shape of 15 mm in longitudinal length and 15 mm in lateral length with a thickness of 0.5 mm was formed.

Example 4

Production of Thermally Conductive Sheet

The same processes as those of example 1 were carried out except that in example 1, to an addition reaction-type liquid-state silicone resin of a two-liquid type prepared by mixing 17.8% by volume of a silicone A liquid (organopolysiloxane having a vinyl group) and 17.8% by volume of a silicone B liquid (organopolysiloxane having an H—Si group) were added to be dispersed therein alumina particles (average particle size: 3 μm, Alumina DAW03, spherical shape, made by Denki Kagaku Kogyo Kabushiki Kaisha) (41.0% by volume) and pitch-based carbon fibers (average major axis length: 150 μm, average minor axis length: 8 μm, Raheama R-A301, made by Teijin Ltd.) (23.4% by volume) so that a silicone resin composition was prepared; thus, a thermally conductive sheet of example 4 having a square shape of 15 mm in longitudinal length and 15 mm in lateral length with a thickness of 0.5 mm was formed.

Example 5

Production of Thermally Conductive Sheet

The same processes as those of example 1 were carried out except that in example 1, to an addition reaction-type liquid-state silicone resin of a two-liquid type prepared by mixing 17.6% by volume of a silicone A liquid (organopolysiloxane having a vinyl group) and 17.6% by volume of a silicone B liquid (organopolysiloxane having an H—Si group) were added to be dispersed therein alumina particles (average particle size: 3 μm, Alumina DAW03, made by Denki Kagaku Kogyo Kabushiki Kaisha) (40.5% by volume) and pitch-based carbon fibers (average major axis length: 150 μm, average minor axis length: 8 μm, Raheama R-A301, made by Teijin Ltd.) (24.3% by volume) so that a silicone resin composition was prepared; thus a thermally conductive sheet of example 5 having a square shape of 15 mm in longitudinal length and 15 mm in lateral length with a thickness of 0.5 mm was formed.

Example 6

Production of Thermally Conductive Sheet

The same processes as those of example 1 were carried out except that in example 1, to an addition reaction-type liquid-state silicone resin of a two-liquid type prepared by mixing 19.5% by volume of a silicone A liquid (organopolysiloxane having a vinyl group) and 19.5% by volume of a silicone B liquid (organopolysiloxane having an H—Si group) were added to be dispersed therein alumina particles (average particle size: 3 μm, Alumina DAW03, spherical shape, made by Denki Kagaku Kogyo Kabushiki Kaisha) (45.0% by volume) and pitch-based carbon fibers (average major axis length: 150 μm, average minor axis length: 8 μm, Raheama R-A301, made by Teijin Ltd.) (16.0% by volume) so that a silicone resin composition was prepared; thus a thermally conductive sheet of example 6 having a square shape of 15 mm in longitudinal length and 15 mm in lateral length with a thickness of 0.5 mm was formed.

Example 7

Production of Thermally Conductive Sheet

The same processes as those of example 1 were carried out except that in example 1, to an addition reaction-type liquid-state silicone resin of a two-liquid type prepared by mixing 18.9% by volume of a silicone A liquid (organopolysiloxane having a vinyl group) and 18.9% by volume of a silicone B liquid (organopolysiloxane having an H—Si group) were added to be dispersed therein alumina particles (average particle size: 3 μm, Alumina DAW03, spherical shape, made by Denki Kagaku Kogyo Kabushiki Kaisha) (43.6% by volume) and pitch-based carbon fibers (average major axis length: 150 μm, average minor axis length: 8 μm, Raheama R-A301, made by Teijin Ltd.)(18.6% by volume) so that a silicone resin composition was prepared; thus a thermally conductive sheet of example 7 having a square shape of 15 mm in longitudinal length and 15 mm in lateral length with a thickness of 0.5 mm was formed.

Example 8

Production of Thermally Conductive Sheet

The same processes as those of example 1 were carried out except that in example 1, the outer peripheral portion of a produced thermally conductive sheet was cut with a commercial cutter knife so that a thermally conductive sheet of example 8 having a square shape of 14 mm in longitudinal length and 14 mm in lateral length with a thickness of 0.5 mm was formed.

Example 9

Production of Thermally Conductive Sheet

The same processes as those of example 1 were carried out except that in example 1, the pitch-based carbon fibers (average major axis length: 150 μm, average minor axis length: 8 μm, Raheama R-A301, made by Teijin Ltd.) was changed to pitch-based carbon fibers (average major axis length: 100 μm, average minor axis length: 8 μm, Raheama R-A401, made by Teijin Ltd.) so that a thermally conductive sheet of example 9 having a square shape of 15 mm in longitudinal length and 15 mm in lateral length with a thickness of 0.5 mm was formed.

Example 10

Production of Thermally Conductive Sheet

The same processes as those of example 1 were carried out except that in example 1, the pitch-based carbon fibers (average major axis length: 150 μm, average minor axis length: 8 μm, Raheama R-A301, made by Teijin Ltd.) was changed to pitch-based carbon fibers (average major axis length: 50 μm, average minor axis length: 8 μm, Raheama R-A201, made by Teijin Ltd.) so that a thermally conductive sheet of example 10 having a square shape of 15 mm in longitudinal length and 15 mm in lateral length with a thickness of 0.5 mm was formed.

Example 11

Production of Thermally Conductive Sheet

The same processes as those of example 1 were carried out except that in example 1, to an addition reaction-type liquid-state silicone resin of a two-liquid type prepared by mixing 17.3% by volume of a silicone A liquid (organopolysiloxane having a vinyl group) and 17.3% by volume of a silicone B liquid (organopolysiloxane having an H—Si group) were added to be dispersed therein alumina particles (average particle size: 3 μm, Alumina DAW03, spherical shape, made by Denki Kagaku Kogyo Kabushiki Kaisha) (39.9% by volume) and pitch-based carbon fibers (average major axis length: 150 μm, average minor axis length: 8 μm, Raheama R-A301, made by Teijin Ltd.) (25.5% by volume) so that a silicone resin composition was prepared; thus a thermally conductive sheet of example 11 having a square shape of 15 mm in longitudinal length and 15 mm in lateral length with a thickness of 0.5 mm was formed.

Example 12

Production of Thermally Conductive Sheet

The same processes as those of example 1 were carried out except that in example 1, the alumina particles (average particle size: 3 μm, Alumina DAW03, spherical shape, made by Denki Kagaku Kogyo Kabushiki Kaisha) were changed to alumina particles (average particle size: 45 μm, Alumina DAW45, spherical shape, made by Denki Kagaku Kogyo Kabushiki Kaisha) so that a thermally conductive sheet of example 12 having a square shape of 15 mm in longitudinal length and 15 mm in lateral length with a thickness of 0.5 mm was formed.

Example 13

Production of Thermally Conductive Sheet

The same processes as those of example 1 were carried out except that in example 1, the alumina particles (average particle size: 3 μm, Alumina DAW03, spherical shape, made by Denki Kagaku Kogyo Kabushiki Kaisha) (42.3 parts by mass) were changed to alumina particles (average particle size: 3 μm, Alumina DAW03, spherical shape, made by Denki Kagaku Kogyo Kabushiki Kaisha) (25 parts by mass) and aluminum nitride (average particle size: 1 μm, made by Tokuyama Corporation) (17.3 parts by mass) so that a thermally conductive sheet of example 13 having a square shape of 15 mm in longitudinal length and 15 mm in lateral length with a thickness of 0.5 mm was formed.

Comparative Example 1

Production of Thermally Conductive Sheet

The same processes as those of example 1 were carried out except that in example 1, the produced silicone cured object was cut into slices with a commercial cutter knife so as to have a thickness of 0.5 mm so that a thermally conductive sheet of comparative example 1 having a square shape of 15 mm in longitudinal length and 15 mm in lateral length with a thickness of 0.5 mm was formed.

Figure 4A:
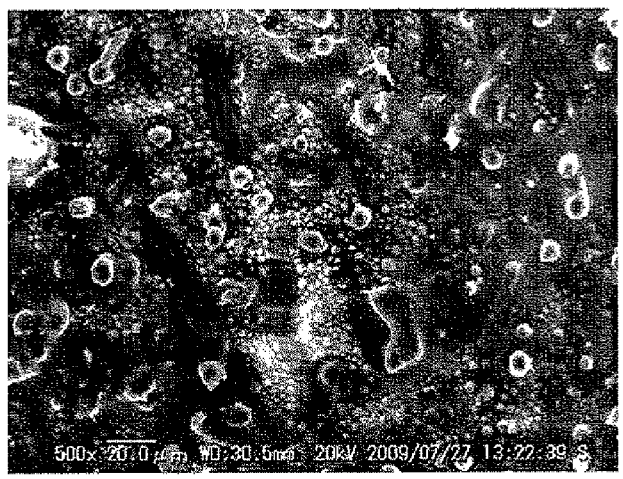
FIG. 4A is an electron microscopic photograph showing a surface of a cut face of the thermal conductive sheet of embodiment 1 that has been cut with the ultrasonic cutter.
Figure 4B:
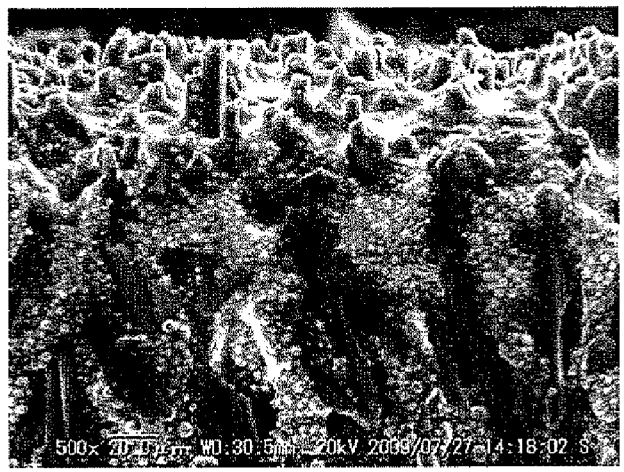
FIG. 4B is an electron microscopic photograph showing the cut face of the thermal conductive sheet of embodiment 1 that has been cut with the ultrasonic cutter.
Figure 4C:
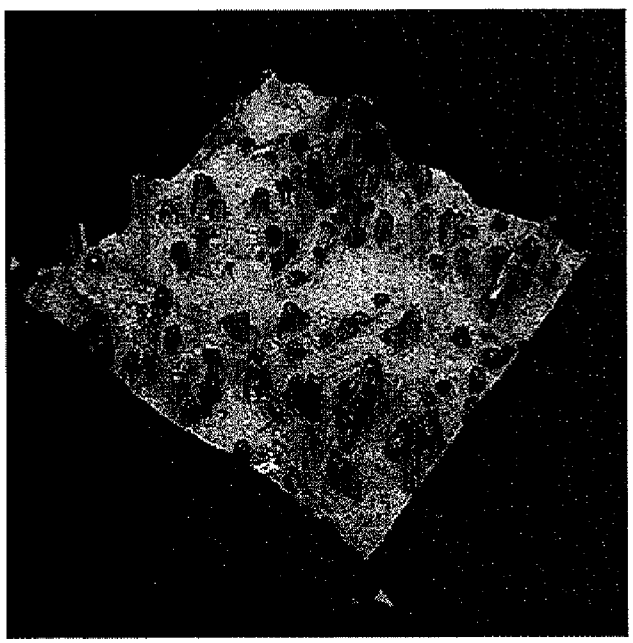
FIG. 4C is a three-dimensional graphic view showing the cut face of the thermal conductive sheet of embodiment 1 that has been cut with the ultrasonic cutter.

In this case, FIG. 4A is an electron microscopic photograph showing a surface of a cut face of the thermally conductive sheet of example 1, FIG. 4B is an electron microscopic photograph showing a cross section thereof, and FIG. 4C is a three-dimensional graphic view thereof, respectively.

Figure 5A:
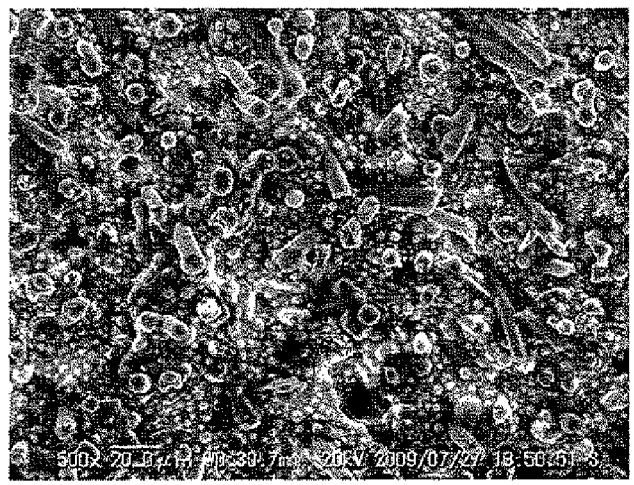
FIG. 5A is an electron microscopic photograph showing a surface of a cut face of a thermal conductive sheet of comparative embodiment 1 that has been cut with a commercial cutter knife.
Figure 5B:
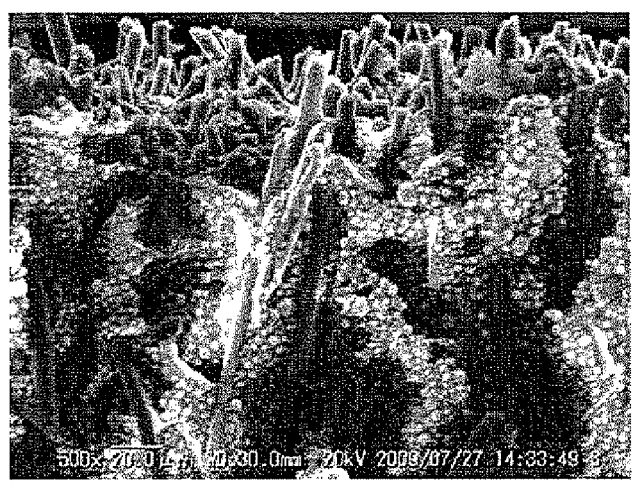
FIG. 5B is an electron microscopic photograph showing the cut face of the thermal conductive sheet of comparative embodiment 1 that has been cut with the commercial cutter knife.
Figure 5C:
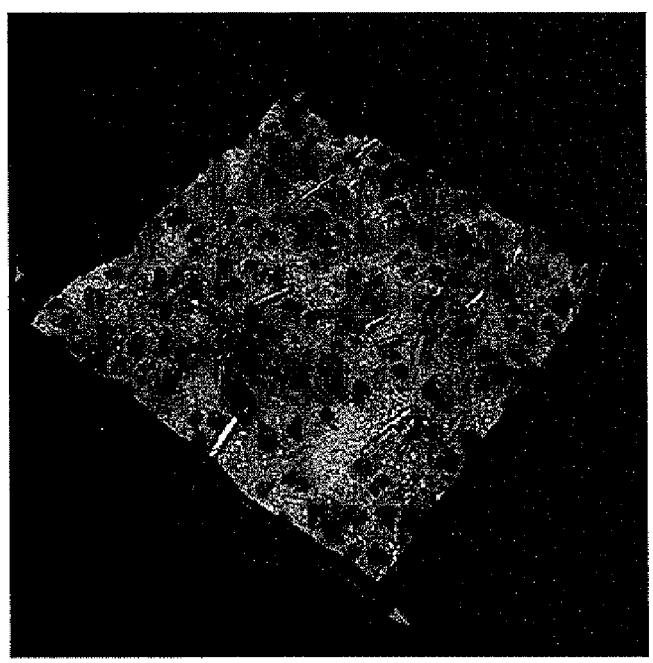
FIG. 5C is a three-dimensional graphic view showing the cut face of the thermal conductive sheet of comparative embodiment 1 that has been cut with the commercial cutter knife.

Moreover, FIG. 5A is an electron microscopic photograph showing a surface of a cut face of the thermally conductive sheet of comparative example 1, FIG. 5B is an electron microscopic photograph showing a cross section thereof, and FIG. 5C is a three-dimensional graphic view thereof, respectively.

When the slice cutting process was carried out by using an ultrasonic cutter as shown in example 1, it was found that the surface roughness became smaller with a reduced thermal resistance in comparison with that in the case of slice cutting process by the use of a commercial cutter knife as shown in comparative example 1.

Comparative Example 2

Production of Thermally Conductive Sheet

The same processes as those of example 1 were carried out except that in example 1, the produced silicone cured object was cut into slices having a thickness of 0.5 with a meat slicer (rotary blade) (Remacom Electric Slicer RSL-A19) so that a thermally conductive sheet of comparative example 2 having a square shape of 15 mm in longitudinal length and 15 mm in lateral length with a thickness of 0.5 mm was formed.

Comparative Example 3

Production of Thermally Conductive Sheet

The same processes as those of example 1 were carried out except that in example 1, the resulting silicone resin composition was stacked and coated so as to produce a silicone stacked product, that this silicone stacked product was heated at 100° C. for 1 hour in an oven so that a silicone cured object was prepared and that the resulting silicone cured object was cut into slices by an ultrasonic cutter so as to have a thickness of 0.5 mm; thus, a thermally conductive sheet of comparative example 3 having a square shape of 15 mm in longitudinal length and 15 mm in lateral length with a thickness of 0.5 mm was formed.

Comparative Example 4

Production of Thermally Conductive Sheet

The same processes as those of comparative example 3 were carried out except that in comparative example 3, the resulting silicone stacked product was cut into slices by using a commercial cutter knife in place of the ultrasonic cutter so that a thermally conductive sheet of comparative example 4 having a square shape of 15 mm in longitudinal length and 15 mm in lateral length with a thickness of 0.5 mm was formed.

Comparative Example 5

Production of Thermally Conductive Sheet

The same processes as those of comparative example 3 were carried out except that in comparative example 3, the resulting silicone stacked product was cut into slices by using a meat slicer (rotary blade) (Remacom Electric Slicer RSL-A19) in place of the ultrasonic cutter so that a thermally conductive sheet of comparative example 5 having a square shape of 15 mm in longitudinal length and 15 mm in lateral length with a thickness of 0.5 mm was formed.

Next, with respect to the thermally conductive sheets of examples 1 to 13 and comparative examples 1 to 5, various characteristics were evaluated in the following manner. The results are shown in Table 1.

<Flame Retardant Property>

Flame retardant tests in accordance with UL-94 standard were carried out on each of the thermally conductive sheets so that the flame retardant property thereof was evaluated.

That is, test pieces indicated by UL94 were prepared, and based upon a vertical burning test method of UL94V, a burning test was carried out on each of the resulting test pieces. In this case, the burning time was given as an addition of igniting periods of time of two times, and an average of 5 test pieces. The results thus obtained were evaluated as any one of grades of UL94 "V-0", "V-1" and "V-2" in accordance with the following criteria. Additionally, those did not satisfy any of these were evaluated as "disqualified".

Based upon the vertical burning test method of UL94V, a burning test was carried out on each of the resulting test pieces. In this case, the burning time was given as an addition of igniting periods of time of two times and an average of 5 test pieces. The results thus obtained were evaluated as any one of grades of UL94 "V-0", "V-1" and "V-2" in accordance with the following criteria. Additionally, those did not satisfy any of these were evaluated as "disqualified".

(Evaluation Criteria)

"V-0": An average burning time after removing an igniting flame was 10 seconds or less, and none of all the samples dropped such a fine flame as to ignite cotton wool.

"V-1": An average burning time after removing an igniting flame was 30 seconds or less, and none of all the samples dropped such a fine flame as to ignite cotton wool.

"V-2": An average burning time after removing an igniting flame was 30 seconds or less, and the samples dropped such a fine flame as to ignite cotton wool.

<Surface Roughness Ra>

The surface roughness Ra of each of the thermally conductive sheets was measured with a laser microscope.

<Slight Stickiness of Outer Peripheral Portion>

Each of the thermally conductive sheets was placed on a plastic plate in a direction perpendicular to the oriented direction of carbon fibers, and the slight stickiness of the outer peripheral portion was confirmed, <Initial Thickness (Thickness Immediately After Cutting Process)>

The initial thickness of each of the thermally conductive sheets was measured by using a thermal conductivity measuring device.

<Thermal Resistance>

The thermal resistance of each of the thermally conductive sheets was measured by using a thermal conductivity measuring device in accordance with ASTM D 5470, with a load of 1 kgf/cm$^2$ being applied thereto.

<Peeling Between Slits or on Stacked Surface>

With respect to the respective thermally conductive sheets, the presence or absence of peeling between slits or on the stacked surface was visually confirmed.

TABLE 1

| Components (% by volume) | Example 1 | Example 2 | Example 3 | Example 4 |
|---|---|---|---|---|
| Silicone A liquid | 18.8 | 18.8 | 18.8 | 17.8 |
| Silicone B liquid | 18.8 | 18.8 | 18.8 | 17.8 |
| Pitch-based carbon fibers (Raheama A301, average major-axis length 150 μm, average minor-axis length 8 μm, made by Teijin Ltd.) | 20.1 | 20.1 | 20.1 | 23.4 |
| Pitch-based carbon fibers (Raheama X401, average major-axis length 100 μm, average minor-axis length 8 μm, made by Teijin Ltd.) | — | — | — | — |
| Pitch-based carbon fibers (Raheama A201, average major-axis length 50 μm, average minor-axis length 8 μm, made by Teijin Ltd.) | — | — | — | — |
| Alumina DAW03 (average particle size 3 μm, made by Denki Kagaku Kogyo Kabushiki Kaisha) | 42.3 | — | — | 41.0 |
| Alumina DAW05 (average particle size 5 μm, made by Denki Kagaku Kogyo Kabushiki Kaisha) | — | 42.3 | — | — |
| Alumina DAW10 (average particle size 10 μm, made by Denki Kagaku Kogyo Kabushiki Kaisha) | — | — | 42.3 | — |

TABLE 1-continued

| | | | | |
|---|---|---|---|---|
| Alumina DAW45 (average particle size 45 μm, made by Denki Kagaku Kogyo Kabushiki Kaisha) | — | — | — | — |
| Total (% by volume) | 100.0 | 100.0 | 100.0 | 100.0 |
| Producing method | Extrusion | Extrusion | Extrusion | Extrusion |
| Slicing method | Ultrasonic slice | Ultrasonic slice | Ultrasonic slice | Ultrasonic slice |
| Flame retardant property | V-0 | V-0 | V-0 | V-0 |
| Surface roughness Ra | 3.7 μm | 4.3 μm | 9.9 μm | 3.2 μm |
| Slight stickiness on outer peripheral portion | Yes | Yes | Yes | Yes |
| Initial thickness | 0.5 mm | 0.5 mm | 0.5 mm | 0.5 mm |
| Thermal resistance | 0.15 K/W | 0.14 K/W | 0.22 K/W | 0.13 K/W |
| Pealing between slits or on lamination surface | No | No | No | No |

| Components (% by volume) | Example 5 | Example 6 | Example 7 | Example 8 |
|---|---|---|---|---|
| Silicone A liquid | 17.6 | 19.5 | 18.9 | 18.8 |
| Silicone B liquid | 17.6 | 19.5 | 18.9 | 18.8 |
| Pitch-based carbon fibers (Raheama A301, average major-axis length 150 μm, average minor-axis length 8 μm, made by Teijin Ltd.) | 24.3 | 16.0 | 18.6 | 20.1 |
| Pitch-based carbon fibers (Raheama X401, average major-axis length 100 μm, average minor-axis length 8 μm, made by Teijin Ltd.) | — | — | — | — |
| Pitch-based carbon fibers (Raheama A201, average major-axis length 50 μm, average minor-axis length 8 μm, made by Teijin Ltd.) | — | — | — | — |
| Alumina DAW03 (average particle size 3 μm, made by Denki Kagaku Kogyo Kabushiki Kaisha) | 40.5 | 45.0 | 43.6 | 42.3 |
| Alumina DAW05 (average particle size 5 μm, made by Denki Kagaku Kogyo Kabushiki Kaisha) | — | — | — | — |
| Alumina DAW10 (average particle size 10 μm, made by Denki Kagaku Kogyo Kabushiki Kaisha) | — | — | — | — |
| Alumina DAW45 (average particle size 45 μm, made by Denki Kagaku Kogyo Kabushiki Kaisha) | — | — | — | — |
| Total (% by volume) | 100.0 | 100.0 | 100.0 | 100.0 |
| Producing method | Extrusion | Extrusion | Extrusion | Extrusion |
| Slicing method | Ultrasonic slice | Ultrasonic slice | Ultrasonic slice | Ultrasonic slice |
| Flame retardant property | V-0 | V-0 | V-0 | V-0 |
| Surface roughness Ra | 3.3 μm | 6.6 μm | 5.7 μm | 8.2 μm |
| Slight stickiness on outer peripheral portion | Yes | Yes | Yes | No |
| Initial thickness | 0.5 mm | 0.5 mm | 0.5 mm | 0.5 mm |
| Thermal resistance | 0.12 K/W | 0.23 K/W | 0.19 K/W | 0.16 K/W |
| Pealing between slits or on lamination surface | No | No | No | No |

| Components (% by volume) | Example 9 | Example 10 | Example 11 | Example 12 | Example 13 |
|---|---|---|---|---|---|
| Silicone A liquid | 18.8 | 18.8 | 17.3 | 18.8 | 18.8 |
| Silicone B liquid | 18.8 | 18.8 | 17.3 | 18.8 | 18.8 |
| Pitch-based carbon fibers (Raheama A301, average major-axis length 150 μm, average minor-axis length 8 μm, made by Teijin Ltd.) | — | — | 25.5 | 20.1 | 20.1 |
| Pitch-based carbon fibers (Raheama X401, average major-axis length 100 μm, average minor-axis length 8 μm, made by Teijin Ltd.) | 20.1 | — | — | — | — |
| Pitch-based carbon fibers (Raheama A201, average major-axis length 50 μm, average minor-axis length 8 μm, made by Teijin Ltd.) | — | 20.1 | — | — | — |
| Alumina DAW03 (average particle size 3 μm, made by Denki Kagaku Kogyo Kabushiki Kaisha) | 42.3 | 42.3 | 39.9 | — | 25 |
| Alumina DAW05 (average particle size 5 μm, made by Denki Kagaku Kogyo Kabushiki Kaisha) | — | — | — | — | — |
| Alumina DAW10 (average particle size 10 μm, made by Denki Kagaku Kogyo Kabushiki Kaisha) | — | — | — | — | — |
| Alumina DAW45 (average particle size 45 μm, made by Denki Kagaku Kogyo Kabushiki Kaisha) | — | — | — | 42.3 | — |
| Aluminum nitride (average particle size: 1 μm, made by Tokuyama Corporation) | — | — | — | — | 17.3 |
| Total (% by volume) | 100.0 | 100.0 | 100.0 | 100.0 | 100.0 |
| Producing method | Extrusion | Extrusion | Extrusion | Extrusion | Extrusion |
| Slicing method | Ultrasonic slice | Ultrasonic slice | Ultrasonic slice | Ultrasonic slice | Ultrasonic slice |
| Flame retardant property | V-0 | V-0 | V-0 | V-0 | V-0 |
| Surface roughness Ra | 7.8 μm | 9.3 μm | 11.1 μm | 9.6 μm | 3.5 μm |

TABLE 1-continued

| | | | | | |
|---|---|---|---|---|---|
| Slight stickiness on outer peripheral portion | Yes | Yes | Yes | Yes | Yes |
| Initial thickness | 0.5 mm | 0.5 mm | 0.5 mm | 0.5 mm | 0.5 mm |
| Thermal resistance | 0.25 K/W | 0.29 K/W | 0.27 K/W | 0.34 K/W | 0.13 K/W |
| Pealing between slits or on lamination surface | No | No | Slightly present | No | No |

| Components (% by volume) | Comparative Example | Comparative Example | Comparative Example | Comparative Example | Comparative Example |
|---|---|---|---|---|---|
| Silicone A liquid | 18.8 | 18.8 | 18.8 | 18.8 | 18.8 |
| Silicone B liquid | 18.8 | 18.8 | 18.8 | 18.8 | 18.8 |
| Pitch-based carbon fibers (Raheama A301, average major-axis length 150 μm, average minor-axis length 8 μm, made by Teijin Ltd.) | 20.1 | 20.1 | 20.1 | 20.1 | 20.1 |
| Pitch-based carbon fibers (Raheama X401, average major-axis length 100 μm, average minor-axis length 8 μm, made by Teijin Ltd.) | — | — | — | — | — |
| Pitch-based carbon fibers (Raheama A201, average major-axis length 50 μm, average minor-axis length 8 μm, made by Teijin Ltd.) | — | — | — | — | — |
| Alumina DAW03 (average particle size 3 μm, made by Denki Kagaku Kogyo Kabushiki Kaisha) | 42.3 | 42.3 | 42.3 | 42.3 | 42.3 |
| Alumina DAW05 (average particle size 5 μm, made by Denki Kagaku Kogyo Kabushiki Kaisha) | — | — | — | — | — |
| Alumina DAW10 (average particle size 10 μm, made by Denki Kagaku Kogyo Kabushiki Kaisha) | — | — | — | — | — |
| Alumina DAW45 (average particle size 45 μm, made by Denki Kagaku Kogyo Kabushiki Kaisha) | — | — | — | — | — |
| Total (% by volume) | 100.0 | 100.0 | 100.0 | 100.0 | 100.0 |
| Producing method | Extrusion | Extrusion | Laminated coat | Laminated coat | Laminated coat |
| Slicing method | Cutter knife | Meat slicer (Rotary blade) | Ultrasonic cutter | Cutter knife | Meat slicer (Rotary blade) |
| Flame retardant property | V-1 | V-1 | V-0 | V-0 | V-0 |
| Surface roughness Ra | 20.1 μm | 23.2 μm | 9.2 μm | 20.8 μm | 18.2 μm |
| Slight stickiness on outer peripheral portion | Yes | Yes | No | No | No |
| Initial thickness | 0.5 mm | 0.5 mm | 0.5 mm | 0.5 mm | 0.5 mm |
| Thermal resistance | 0.39 K/W | 0.37 K/W | 0.17 K/W | 0.37 K/W | 0.33 K/W |
| Pealing between slits or on lamination surface | No | No | Yes | Yes | Yes |

The results of Table 1 indicate that in the case when a slice cutting process was carried out by using an ultrasonic cutter as shown in examples 1 to 13, the thermal resistance was lowered in comparison with the case where the slice cutting process was carried out by using a commercial cutter knife as shown in comparative example 1 so that a desirable thermal conductivity was exerted.

In example 9, the thermal resistance became slightly greater because of its shorter fiber length of the pitch-based carbon fibers in comparison with that of example 1.

In example 10, the thermal resistance became slightly greater because of its shorter fiber length of the pitch-based carbon fibers in comparison with that of example 1.

In example 11, since the filling amount of the pitch-based carbon fibers was greater, and since the dispersion of the pitch-based carbon fibers was slightly poor, in comparison with those of example 1, a slightly peeled state on the interface was left even after the passage through the slit.

In example 12, since the average particle size was larger than that of example 1 to cause disturbance in the orientation of the pitch-based carbon fibers, the thermal resistance became slightly greater.

In comparative example 1, since a slice cutting process was carried out by using a commercial cutter in comparison with example 1, the surface irregularities became greater to cause an increased thermal resistance.

In comparative example 2, since a slice cutting process was carried out by using a meat slicer (rotary blade) in comparison with example 1, the surface irregularities became greater to cause an increased thermal resistance.

In comparative example 3, since a lamination coated product was used in comparison with example 1, peeling occurred on the interface upon application of a load thereto. Moreover, since the lamination coated product was not extruded into a mold, slight stickiness was not exerted on the outer peripheral portion.

In comparative example 4, since a lamination coated product was used in comparison with example 1, peeling occurred on the interface upon application of a load thereto. Moreover, since the lamination coated product was not extruded into a mold, slight stickiness was not exerted on the outer peripheral portion. Since the slicing process was carried out by using a commercial cutter knife, the surface irregularities became greater to cause an increased thermal resistance.

In comparative example 5, since a lamination coated product was used in comparison with example 1, peeling occurred on the interface upon application of a load thereto. Moreover, since the lamination coated product was not extruded into a mold, slight stickiness was not exerted on the outer peripheral portion. Since the slicing process was carried out by using a meat slicer (rotary blade), the surface irregularities became greater to cause an increased thermal resistance.

Example 14

The same processes as those of example 1 were carried out except that in example 1, the silicone cured object was sliced with an ultrasonic cutter so as to have a thickness of 1.0 mm so that a thermally conductive sheet of example 14 was formed.

When the resulting thermally conductive sheet was measured by applying a load of 1 kgf/cm², the resulting thickness was 0.9 mm.

Example 15

The same processes as those of example 1 were carried out except that in example 1, the silicone cured object was sliced with an ultrasonic cutter so as to have a thickness of 1.5 mm so that a thermally conductive sheet of example 15 was formed.
When the resulting thermally conductive sheet was measured by applying a load of 1 kgf/cm², the resulting thickness was 1.4 mm.

Comparative Example 6

The same processes as those of comparative example 1 were carried out except that in comparative example 1, the silicone cured object was sliced with a commercial cutter knife so as to have a thickness of 1.0 mm so that a thermally conductive sheet of comparative example 6 was formed.
When the resulting thermally conductive sheet was measured by applying a load of 1 kgf/cm² thereto, the resulting thickness was 0.9 mm.

Comparative Example 7

Figure 6:
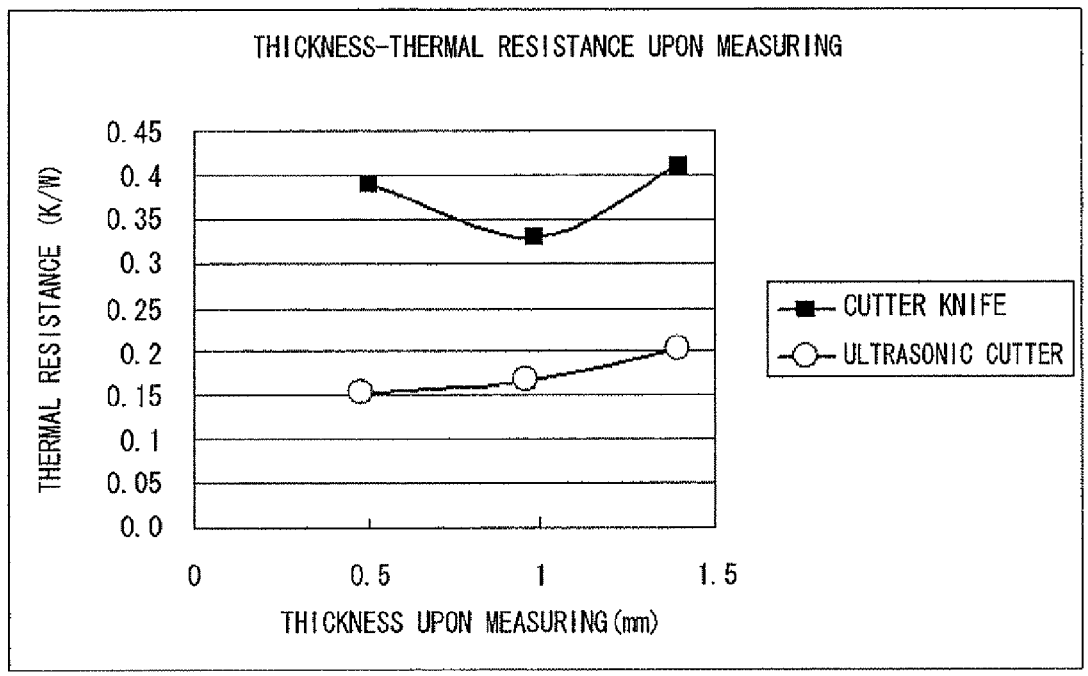
FIG. 6 is a graph that shows a relationship between a thickness and a thermal resistance obtained when cutting processes are carried out by using the commercial cutter knife and the ultrasonic cutter, with their thicknesses being changed.

The same processes as those of comparative example 1 were carried out except that in comparative example 1, the silicone cured object was sliced with a commercial cutter knife so as to have a thickness of 1.5 mm so that a thermally conductive sheet of comparative example 7 was formed.
When the resulting thermally conductive sheet was measured by applying a load of 1 kgf/cm² thereto, the resulting thickness was 1.4 mm.
Next, with respect to example 1, examples 14 and 15, comparative example 1 and comparative examples 6 and 7, the same processes as those of example 1 and comparative example 1 were carried out, with a load of 1 kgf/cm² being applied thereto, so that the thermal resistance of each of the thermally conductive sheets was measured. In this case, when the thermally conductive sheet (0.5 mm in thickness immediately after the cutting process) of each of example 1 and comparative example 1 was measured by applying a load of 1 kgf/cm² thereto, the resulting thickness was 0.4 mm. The results thereof are shown in FIG. 6.
The results shown FIG. 6 indicate that in example 1 and examples 14 and 15 in which the ultrasonic cutter was used, the thermal resistance was lowered regardless of the thickness of the sheet in comparison with comparative example 1 and comparative examples 6 and 7 in which the commercial cutter knife was used, thereby making it possible to exert a superior thermal conductivity.

Comparative Example 8

Figure 7:
FIG. 7 is a photograph of a cross section in the thickness direction of the thermal conductive sheet of embodiment 1.
Figure 8:
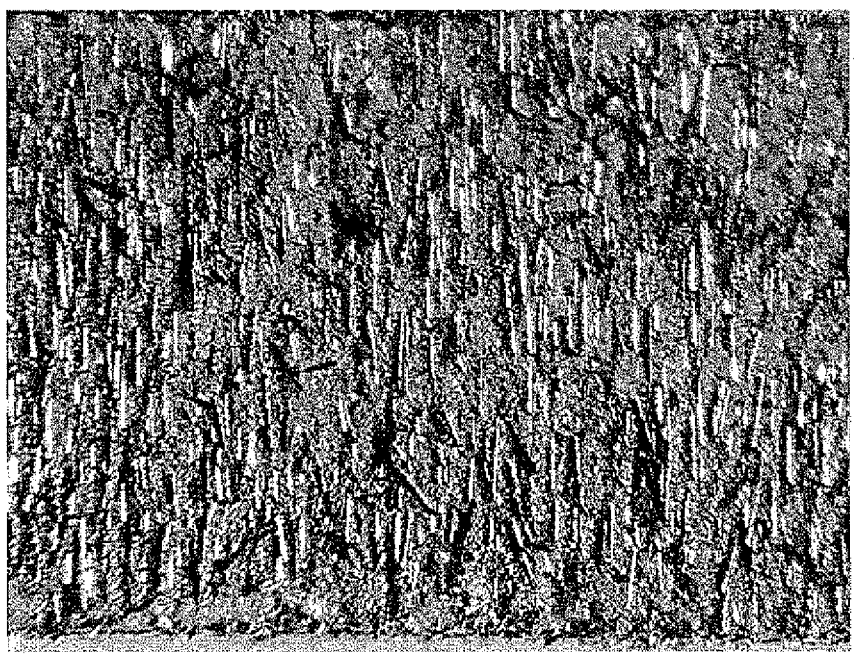
FIG. 8 is a photograph of a cross section in the thickness direction of the thermal conductive sheet formed in accordance with embodiment 1 described in JP-A No. 2003-200437.

In the same manner as in example 1 described in JP-A No. 2003-200437, with a magnetic field being applied thereto at a normal temperature, graphitized carbon fibers, subjected to a surface treatment with a silane coupling agent, were oriented in a fixed direction by the magnetic field, and the carbon fibers were then thermally cured so that a thermally conductive sheet having a thickness of 2 mm of comparative example 8 was formed.
FIG. 8 shows a microscopic photograph (200 times in magnification) of a cross section in the thickness direction of the resulting thermally conductive sheet of comparative example 8. Moreover, FIG. 7 shows a microscopic photograph (200 times in magnification) of a cross section in the thickness direction of the thermally conductive sheet of example 1.
The results shown in FIGS. 7 and 8 indicate that since, in comparative example 8, all the carbon fibers were oriented in the thickness direction (perpendicular direction) of the sheet as shown in FIG. 8, a problem was raised in that when the sheet was bent, it was easily broken (cracked). In contrast, in example 1, in the case when the sheet was produced by an extrusion method as shown in FIG. 7, since some portions of the carbon fibers were not oriented in the thickness direction (perpendicular direction), the sheet was hardly broken (hardly cracked) even when it was bent.

Example 16

A silicone cured object produced by using the same silicone resin composition as that of example 1 was sliced with an ultrasonic cutter (transmission frequency: 20.5 kHz, amplitude: 50 to 70 μm) so as to have a thickness of 0.8 mm so that a thermally conductive sheet was produced. At this time, as shown in Table 2, the silicone cured objects were disposed, with an angle, made by the thickness direction of the silicone cured object (thermally conductive sheet) cut with the ultrasonic cutter and the anisotropic thermally conductive filler (carbon fibers), being varied step by step from 0° to 90°, and ultrasonic sliced so that thermally conductive sheets of samples No. 1 to No. 9 were produced.
With respect to the resulting thermally conductive sheets of samples No. 1 to No. 9, various characteristics thereof in the case when a load of 1 kgf/cm², a load of 2 kgf/cm² and a load of 3 kgf/cm² were respectively applied thereto were measured. The results are shown in Table 2 and FIGS. 10 to 12.
The thermal resistance was measured in the same manner as in the aforementioned examples. Moreover, the compression rate was measured in the following manner. The other physical properties were measured in the same manner as in the aforementioned examples.
<Compression Rate>
The compression rate refers to a value (%) that indicates how much degree of thickness of a thermally conductive sheet is compressed upon application of a load thereto relative to the thickness of the thermally conductive sheet prior to the measurement.

TABLE 2

| | Sample No | | | | |
| --- | --- | --- | --- | --- | --- |
| | 1 | 2 | 3 | 4 | 5 |
| Silicone A liquid | 18.8 | 18.8 | 18.8 | 18.8 | 18.8 |
| Silicone B liquid | 18.8 | 18.8 | 18.8 | 18.8 | 18.8 |
| Pitch-based carbon fibers (Raheama A301, average major-axis length 150 μm, average minor-axis length 8 μm, made by Teijin Ltd.) | 20.1 | 20.1 | 20.1 | 20.1 | 20.1 |

TABLE 2-continued

|  | | | | | |
|---|---|---|---|---|---|
| Pitch-based carbon fibers (Raheama X401, average major-axis length 100 μm, average minor-axis length 8 μm, made by Teijin Ltd.) | — | — | — | — | — |
| Pitch-based carbon fibers (Raheama A201, average major-axis length 100 μm, average minor-axis length 8 μm, made by Teijin Ltd.) | — | — | — | — | — |
| Alumina DAW03 (DENKA Kabushiki Kaisha) | 42.3 | 42.3 | 42.3 | 42.3 | 42.3 |
| Alumina DAW05 (DENKA Kabushiki Kaisha) | — | — | — | — | — |
| Alumina DAW10 (DENKA Kabushiki Kaisha) | — | — | — | — | — |
| Alumina DAW15 (DENKA Kabushiki Kaisha) | — | — | — | — | — |
| Aluminum nitride (average particle size: 1 μm, made by Tokuyama Corporation | — | — | — | — | — |
| Total (% by volume) | 100 | 100 | 100 | 100 | 100 |
| Producing method | Extrusion | Extrusion | Extrusion | Extrusion | Extrusion |
| Slicing method | Ultrasonic slice | Ultrasonic slice | Ultrasonic slice | Ultrasonic slice | Ultrasonic slice |
| Load: 1 kgf/cm² — Angle (°) of carbon fibers relative to thickness direction of thermally conductive sheet | 0 | 5 | 10 | 15 | 30 |
| Thermal resistance (K/W) | 0.19 | 0.20 | 0.21 | 0.20 | 0.22 |
| Compression rate (%) | 4.5 | 5.6 | 6.8 | 7.8 | 8.5 |
| Load: 2 kgf/cm² — Angle (°) of carbon fibers relative to thickness direction of thermally conductive sheet | 0 | 5 | 10 | 15 | 30 |
| Thermal resistance (K/W) | 0.15 | 0.16 | 0.16 | 0.17 | 0.19 |
| Compression rate (%) | 12.4 | 14.6 | 16.7 | 18.7 | 21.4 |
| Load: 3 kgf/cm² — Angle (°) of carbon fibers relative to thickness direction of thermally conductive sheet | 0 | 5 | 10 | 15 | 30 |
| Thermal resistance (K/W) | 0.14 | 0.14 | 0.15 | 0.16 | 0.18 |
| Compression rate (%) | 22.5 | 24.6 | 26.8 | 28.8 | 31.4 |
| Flame retardant property | V-0 | V-0 | V-0 | V-0 | V-0 |
| Initial thickness | 0.8 mm | 0.8 mm | 0.8 mm | 0.8 mm | 0.8 mm |
| Degree of orientation of carbon fibers within | 0° | 5° | 10° | 15° | 30° |
| Pealing between slits or on lamination surface | No | No | No | No | No |
| Surface roughness | 6.7 μm | 7.2 μm | 7.4 μm | 7.9 μm | 7.6 μm |

| | Sample No. | | | |
|---|---|---|---|---|
| | 6 | 1 | 8 | 9 |
| Silicone A liquid | 18.8 | 18.8 | 18.8 | 18.8 |
| Silicone B liquid | 18.8 | 18.8 | 18.8 | 18.8 |
| Pitch-based carbon fibers (Raheama A301, average major-axis length 150 μm, average minor-axis length 8 μm, made by Teijin Ltd.) | 20.1 | 20.1 | 20.1 | 20.1 |
| Pitch-based carbon fibers (Raheama X401, average major-axis length 100 μm, average minor-axis length 8 μm, made by Teijin Ltd.) | — | — | — | — |
| Pitch-based carbon fibers (Raheama A201, average major-axis length 100 μm, average minor-axis length 8 μm, made by Teijin Ltd.) | — | — | — | — |
| Alumina DAW03 (DENKA Kabushiki Kaisha) | 42.3 | 42.3 | 42.3 | 42.3 |
| Alumina DAW05 (DENKA Kabushiki Kaisha) | — | — | — | — |
| Alumina DAW10 (DENKA Kabushiki Kaisha) | — | — | — | — |
| Alumina DAW15 (DENKA Kabushiki Kaisha) | — | — | — | — |
| Aluminum nitride (average particle size: 1 μm, made by Tokuyama Corporation | — | — | — | — |
| Total (% by volume) | 100 | 100 | 100 | 100 |
| Producing method | Extrusion | Extrusion | Extrusion | Extrusion |
| Slicing method | Ultrasonic slice | Ultrasonic slice | Ultrasonic slice | Ultrasonic slice |
| Load: 1 kgf/cm² — Angle (°) of carbon fibers relative to thickness direction of thermally conductive sheet | 45 | 60 | 75 | 90 |
| Thermal resistance (K/W) | 0.28 | 0.4 | 0.67 | 0.79 |
| Compression rate (%) | 13.64 | 9.95 | 11.057 | 12.06 |
| Load: 2 kgf/cm² — Angle (°) of carbon fibers relative to thickness direction of thermally conductive sheet | 45 | 60 | 75 | 90 |
| Thermal resistance (K/W) | 0.25 | 0.36 | 0.60 | 0.70 |
| Compression rate (%) | 27.24 | 23.29 | 22.27 | 22.54 |
| Load: 3 kgf/cm² — Angle (°) of carbon fibers relative to thickness direction of thermally conductive sheet | 45 | 60 | 75 | 90 |
| Thermal resistance (K/W) | 0.25 | 0.34 | 0.56 | 0.65 |
| Compression rate (%) | 34.71 | 31.19 | 29.26 | 29.88 |
| Flame retardant property | V-0 | V-0 | V-0 | V-0 |
| Initial thickness | 0.8 mm | 0.8 mm | 0.8 mm | 0.8 mm |
| Degree of orientation of carbon fibers within | 45° | 60° | 75° | 90° |
| Pealing between slits or on lamination surface | No | No | No | No |
| Surface roughness | 8.1 μm | 9.8 μm | 9.6 μm | 8.4 μm |

Figure 10:
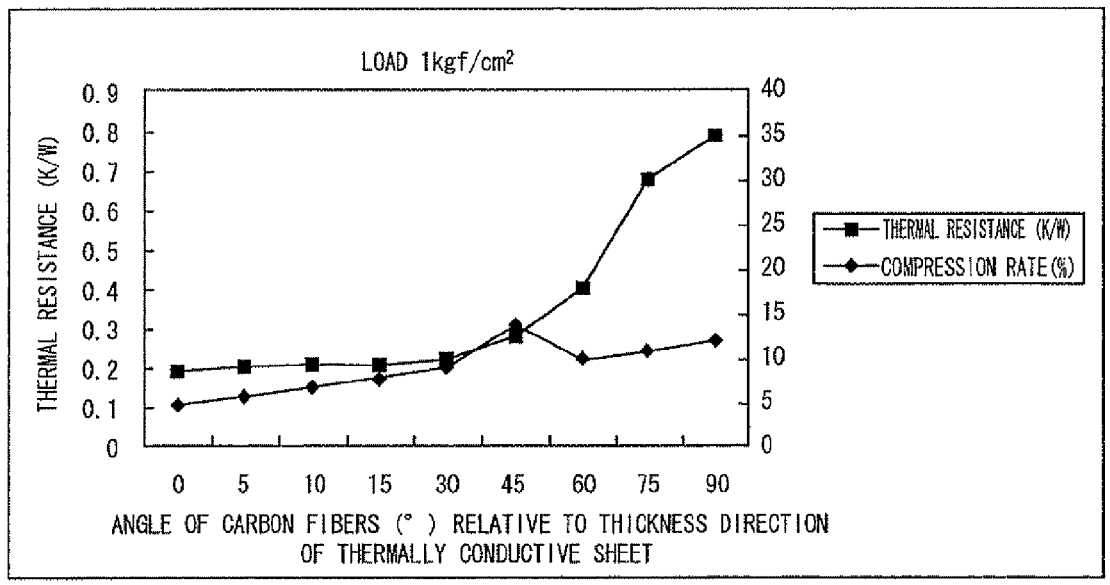
FIG. 10 is a graph that shows a relationship among an angle, a thermal resistance and a compression rate of a carbon fiber relative to the thickness direction of a thermal conductive sheet of embodiment 16 upon application of a load of 1 kgf/cm$^2$.
Figure 11:
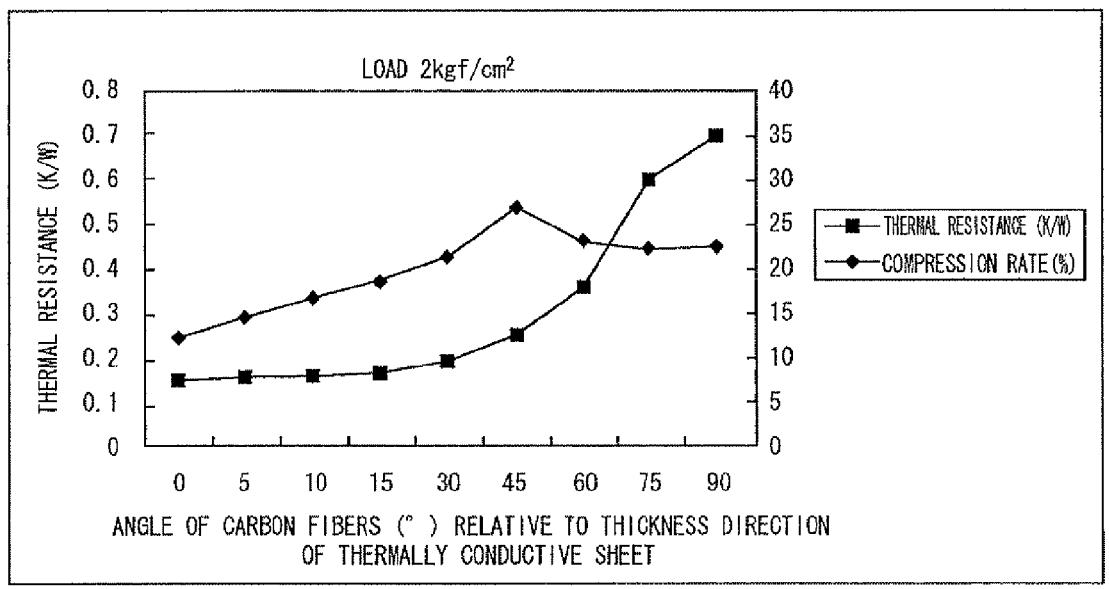
FIG. 11 is a graph that shows a relationship among an angle, a thermal resistance and a compression rate of a carbon fiber relative to the thickness direction of the thermal conductive sheet of embodiment 16 upon application of a load of 2 kgf/cm$^2$.
Figure 12:
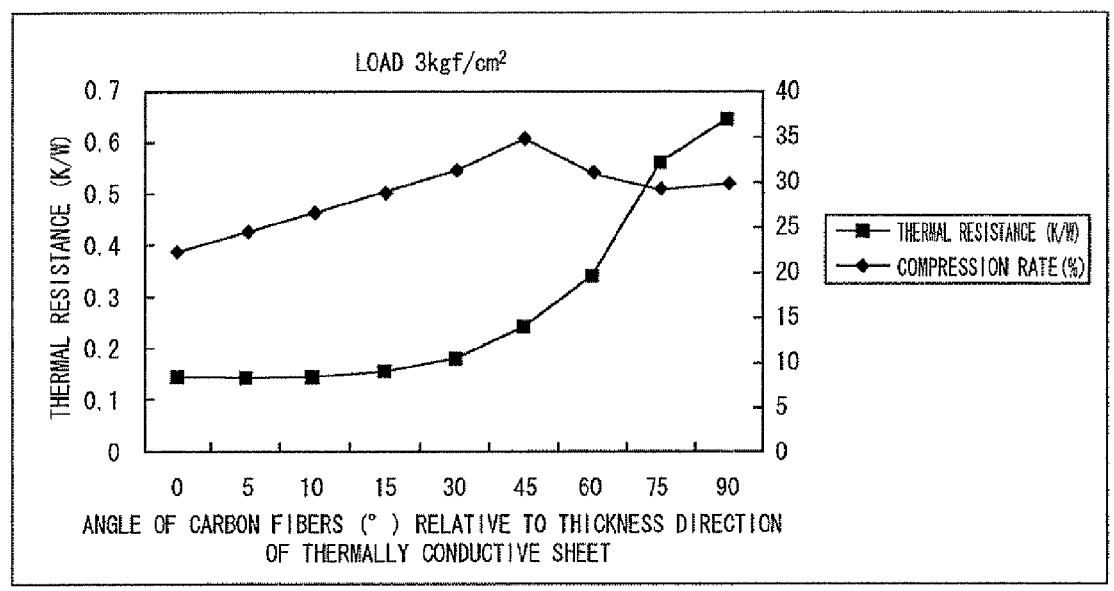
FIG. 12 is a graph that shows a relationship among an angle, a thermal resistance and a compression rate of a carbon fiber relative to the thickness direction of the thermal conductive sheet of embodiment 16 upon application of a load of 3 kgf/cm$^2$.

The results shown in Table 2 and FIGS. 10 to 12 indicate that until the angle made by the thickness direction of the thermally conductive sheet and the anisotropic thermally conductive filler (carbon fibers) has reached 45°, the compression rate increases in response to the load; however, when the angle made by the thickness direction of the thermally conductive sheet and the carbon fibers exceeds 45°, the compression rate tends to be lowered reversely. Moreover, it is also found that the thermal resistance value abruptly deteriorates when the angle made by the thickness direction of the thermally conductive sheet and the carbon fibers exceeds 45°.

Modified Example

By the way, since the thermally conductive sheet needs to have high flexibility and shape flow-up property, it is necessary to prevent deformation of the cured object serving as a sheet base material and also to slice it into a thin uniform thickness. Moreover, in the case when the sliced surface of the thermally conductive sheet is rubbed with the cutting blade by the frictional resistance to cause disturbance in the orientation of the carbon fibers, a reduction in the thermal conductivity is caused; therefore, it is desirable for the thermally conductive sheet to have good thermal conductivity, uniformity in thickness, and superior flexibility and shape follow-up property.

Such a thermally conductive sheet 10 is characterized by being composed of 10 to 25% by volume of carbon fibers and 40 to 55% by volume of aluminum oxide (alumina). The thermally conductive sheet 10 is a sheet-shaped product in which, for example, a silicone resin is used as its polymer, pitch-based carbon fibers are used as its thermally conductive material and for example, spherical alumina is used as a filler, with these materials being blended with one another. As described earlier, the thermally conductive sheet 10 is formed by processes in which a thermally conductive composition having the polymer, carbon fibers and alumina is allowed to pass through a slit so that the carbon fibers are oriented in the extrusion direction, the resulting molded product is then cured to form a sheet base material 11, and the sheet base material 11 is sliced into a sheet form in a direction perpendicular to the extrusion direction of the sheet base material 11.

The silicone resin, which has superior physical properties, such as flexibility, shape follow-up property and heat resistance, is formed by mixing a first silicone resin and a second silicone resin with each other. As the first silicone resin, polyalkenyl alkylsiloxane is used, and as the second silicone resin, polyalkyl hydrogen siloxane serving as a curing agent for the polyalkenyl alkylsiloxane is used.

Additionally, from the commercial viewpoint, the first silicone resin is available as a product in which a platinum catalyst serving as a catalyst in the above-mentioned reaction is mixed. Moreover, from the commercial viewpoint, the second silicone resin is available as a product in which in addition to polyalkyl hydrogen siloxane, the above-mentioned polyalkenyl alkylsiloxane and a reaction adjusting agent are mixed.

In the case when the first silicone resin and the second silicone resin are mixtures as described above, by simply blending the same amounts of these two resins with each other based upon weight ratios, it is possible to make the compounding ratio of the first silicone resin relatively higher, with the compounding ratio of the second silicone resin serving as a curing agent being lowered.

As a result, it becomes possible to prevent the thermally conductive sheet 10 from being excessively cured, and consequently to generate a constant compression rate. Since the thermally conductive sheet 10 is interpolated between heat generating electronic parts and the heat sink, it needs to have a predetermined compression rate in the thickness direction so as to make these members in tightly contact with each other; therefore, at least a compression rate of 3% or more, preferably 6% or more, more preferably 10% or more, is desirably prepared.

Moreover, as shown in FIG. 13, the thermally conductive sheet 10 is designed such that the compounding ratio between the first silicone resin and the second silicone resin is set to 55:45 to 50:50. With this arrangement, even when thinly sliced to have the initial thickness of 0.5 mm, the thermally conductive sheet 10 is allowed to have a compression rate of 3% or more (3.82%). Moreover, in the case of 52:48, the thermally conductive sheet 10 has a compression rate of 10.49% with the initial thickness of 1.0 mm, and in the case of 55:45 to 52:48, it has a compression rate of 13.21% with the initial thickness of 1.0 mm, both of which correspond to compression rates of 10% or more.

In this manner, since the thermally conductive sheet 10 has a compression rate of 3% or more in the thickness direction in spite of its structure with carbon fibers oriented in the thickness direction, it is superior in flexibility and shape follow-up property, and allows the heat generating parts and the heat sink to be more tightly made in contact with each other, thereby making it possible to radiate heat effectively.

The pitch-based carbon fibers are composed of pitch as a main material, which is subjected to various treatments, such as a fusion-spinning process, an anti-fusing treatment and a carbonizing treatment, and then subjected to a heating treatment at high temperatures in a range of 2000 to 3000° C., or exceeding 3000° C., so as to be graphitized. The material pitch is classified into isotropic pitch that is optically disordered with no bias being exerted and anisotropic pitch (mesophase pitch) in which constituent molecules are arranged in a liquid crystal state, with an optical anisotropic property being exerted, and carbon fibers produced from the anisotropic pitch are more excellent in mechanical properties than those carbon fibers produced from the isotropic pitch, and have higher electrical and thermal conductivities; therefore, it is preferable to use these mesophase pitch-based graphitized carbon fibers.

Additionally, alumina has a particle size that is smaller than that of carbon fibers, and capable of sufficiently functioning as a thermally conductive material, and is filled in tightly cooperation with carbon fibers. Thus, the thermally conductive sheet 10 can obtain sufficient paths for thermal conductivity. As the alumina, DAW03 (made by Denki Kagaku Kogyo Kabushiki Kaisha) can be used.

<Compounding Ratio of Alumina and Carbon Fibers>

Depending on the compounding rate between the carbon fibers and alumina, the thermally conductive sheet 10 is varied in its evaluation in burning tests and evaluation as to easiness in extrusion at the time of extruding a mixed composition composed of first and second silicone resins, carbon fibers and alumina mixed with one another into a rectangular pillar shape by using a syringe upon producing the sheet base material 11 from which the thermally conductive sheet 10 is cut out. Additionally, the sheet base material 11 has its carbon fibers oriented in the longitudinal direction when it is allowed to pass through a slit formed inside of the syringe, and after passing through the slit, is again molded into a rectangular pillar shape.

FIG. 14 shows the evaluation in burning tests (UL94V) of the thermally conductive sheet 10 when the compounding rate of the carbon fibers relative to 50 g of alumina is changed and the evaluation as to easiness in extrusion at the time of extruding the sheet base material 11 into a rectangular pillar shape. Additionally, the thermally conductive sheet 10 is formed by blending, as silicone resins, 5.4 g of the first silicone resin (mixture of polyalkenyl alkylsiloxane and platinum catalyst) and 5.4 g of the second silicone resin (mixture of polyalkyl hydrogen siloxane, polyalkenyl alkylsiloxane and a reaction adjusting agent).

As shown in FIG. 14, by blending 14 g or more of carbon fibers to 50 g of alumina, evaluations corresponding to V0 were obtained in the burning tests (UL94V) in both of the thermally conductive sheets 10 having thicknesses 1 mm and 2 mm. Moreover, in accordance with the thermally conductive sheet 10 having a thickness of 2 mm, by blending 8 g or more of carbon fibers to 50 g of alumina, the evaluation corresponding to V0 was obtained in the burning tests (UL94V). At this time, the volume ratio of 50 g of alumina in the thermally conductive sheet 10 was 45.8% by volume, and the volume ratio of 8 g of carbon fibers therein was 13.3% by volume.

Moreover, by blending 8 g or 10 g of carbon fibers to 50 g of alumina, the thermally conductive sheet 10 is allowed to desirably maintain the easiness of extrusion in the producing process of the sheet base material 11. In other words, the sheet base material 11 is allowed to smoothly pass through the slit formed inside the syringe, and also to maintain its rectangular pillar shape.

In the same manner, by also blending 12 g or 14 g of carbon fibers to 50 g of alumina, the thermally conductive sheet 10 is allowed to desirably maintain the easiness of extrusion in the producing process of the sheet base material 11. In other words, the sheet base material 11 is allowed to smoothly pass through the slit formed inside the syringe, and also to maintain its rectangular pillar shape. Additionally, the hardness of this sheet base material 11 is higher than that in the case of blending 8 g or 10 g of the carbon fibers thereto.

In the case when 16 g of the carbon fibers were blended to 50 g of alumina, the thermally conductive sheet 10 had its easiness in extrusion in the producing process of the sheet base material 11 slightly impaired. That is, since the sheet base material 11 was hard, there was a problem in which one portion of the base material leaked through a jig for use in securing the slit formed inside the syringe. However, it was possible to allow the base material passed through the slit to maintain its rectangular pillar shape. At this time, the volume ratio of 50 g of alumina in the thermally conductive sheet 10 was 40.4% by volume, and the volume ratio of 16 g of carbon fibers therein was 23.5% by volume.

Moreover, in the case when 17 g of the carbon fibers were blended thereto, the thermally conductive sheet 10 failed to be extruded in the producing process of the sheet base material 11. That is, since the sheet base material 11 was hard, there was a problem in which one portion of the base material leaked through a jig for use in securing the slit formed inside the syringe. Moreover, base materials that had passed through the slit were not mutually combined with each other, failing to maintain its rectangular pillar shape.

Based upon the facts described above, it has been found that in the case when, in particular, a high flame retardant property corresponding to V0 is required in the burning tests UL94V, the compounding amount of the carbon fibers relative to 50 g of alumina is preferably set to 14 g in the case of the sheet thickness of 1 mm, and also to 8 g to 16 g in the case of the sheet thickness of 2 mm.

Figures 15, 16:
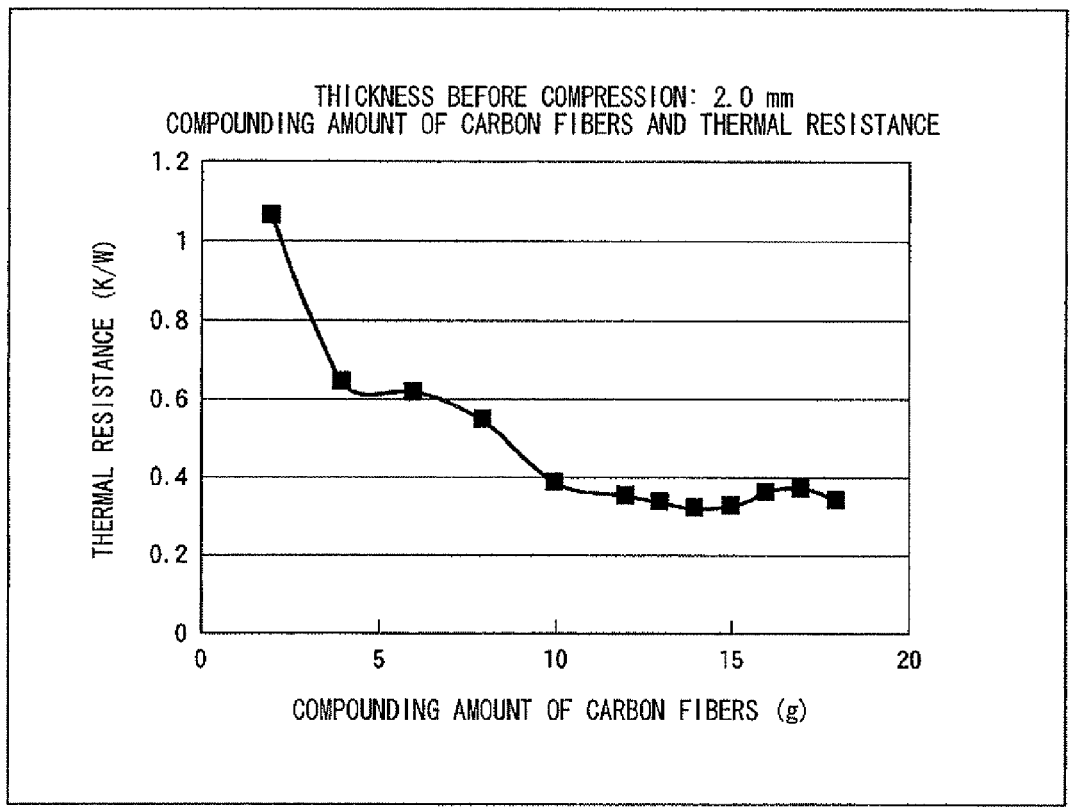
FIG. 15 is a graph showing a relationship between a compounding amount of carbon fibers and a thermal resistance in the thermally conductive sheet.
FIG. 16 is a table showing compounding amounts of materials forming the thermally conductive sheet.

Moreover, as shown in FIG. 15, the compounding amount of the carbon fibers and the thermal resistance value are correlated with each other. As shown in FIG. 15, as the compounding amount of the carbon fibers increases, the thermal resistance (K/W) is lowered; however, it is found that when the compounding amount becomes about 10 g or more, the thermal resistance value is stabilized. In contrast, in the case when 17 g or more of the carbon fibers are blended thereto, since the extrusion of the sheet base material 11 becomes difficult as described earlier, the compounding amount of the carbon fibers in the thermal conductive sheet 10 is preferably set to 10 g or more to 16 g or less. In this case, with respect to the thermally conductive sheet 10 having a thickness of 1 mm, the compounding amount of the carbon fibers was set to 14 g relative to 50 g of alumina, from the viewpoints of flame retardant property of the thermally conductive sheet 10 and easiness in extrusion of the sheet base material 11, and in this compounding amount, as shown in FIG. 15, the value of thermal resistance was kept low and stabilized.

Based upon the above-mentioned facts, as an example, FIG. 16 shows compounding ratios of a thermally conductive sheet 10 with a thickness of 1 m that was produced based upon optimal compounding ratios (weight ratios). As shown in FIG. 16, 5.4 g (7.219% by weight) of a mixture of polyalkenyl alkylsiloxane and a platinum catalyst was used as the first silicone resin, 5.4 g (7.219% by weight) of a mixture of polyalkyl hydrogen siloxane, polyalkenyl alkylsiloxane and a reaction adjusting agent was used as the second silicone resin, 50 g (66.8449% by weight) of DAW03 (trade name) was used as alumina, and 14 g (18.7166% by weight) of R-A301 (trade name, made by Teijin Ltd.) was used as pitch-based carbon fibers.

<Slicing Device>

Figure 17:
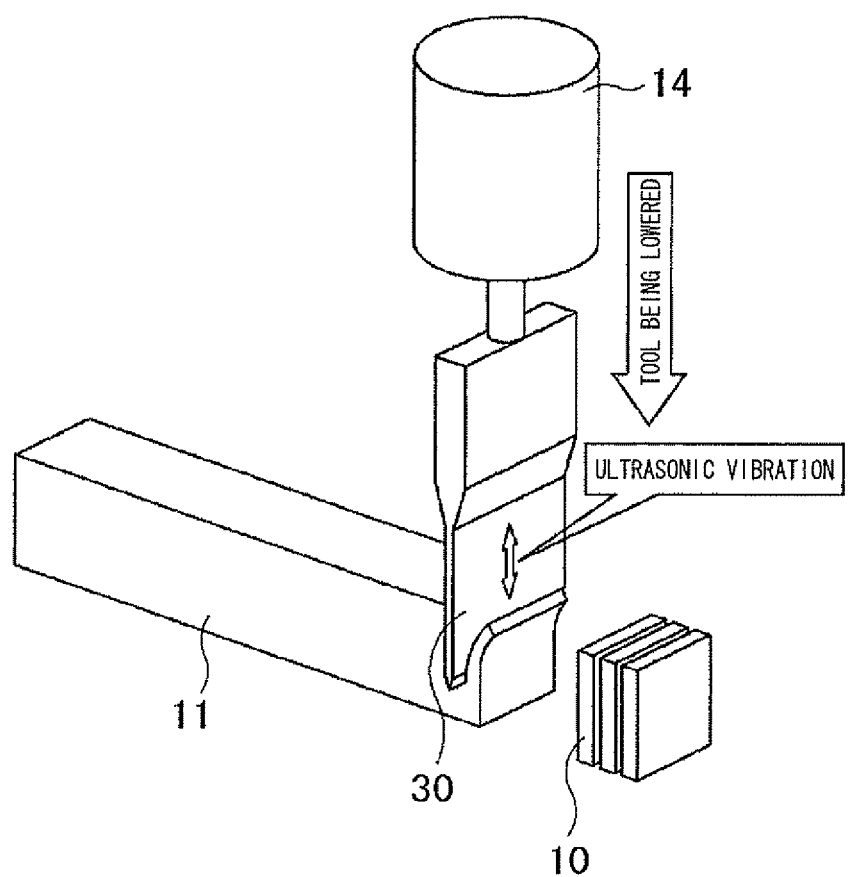
FIG. 17 is a perspective view that shows processes for producing a thermally conductive sheet by slicing the sheet base material.

Next, the following description will discuss a structure of a slicing device 12 for use in slicing the sheet base material 11 into individual thermally conductive sheets 10 so as to obtain the thermally conductive sheet 10 having the compounding ratios shown in FIG. 16. As shown in FIG. 17, the slicing device 12 can produce the thermally conductive sheet 10, with the carbon fibers being oriented therein, by slicing the sheet base material 11 with an ultrasonic cutter 14. Therefore, the slicing device 12 makes it possible to obtain a thermally conductive sheet 10 having a superior thermal conductivity, with its carbon fibers being oriented in the thickness direction.

In this case, the sheet base material 11 is formed through processes in which, after the first and second silicone resins, alumina and carbon fibers have been charged into a mixer and mixed therein, the resulting mixture is extruded into a rectangular pillar shape having a predetermined size by the syringe formed in the mixer. At this time, when the sheet base material 11 is allowed to pass through the slit formed inside the syringe, the carbon fibers are oriented in the longitudinal direction. After having been extruded into the rectangular pillar shape, the sheet base material 11 is put into an oven together with the mold, and thermally cured and completed.

Figure 18:
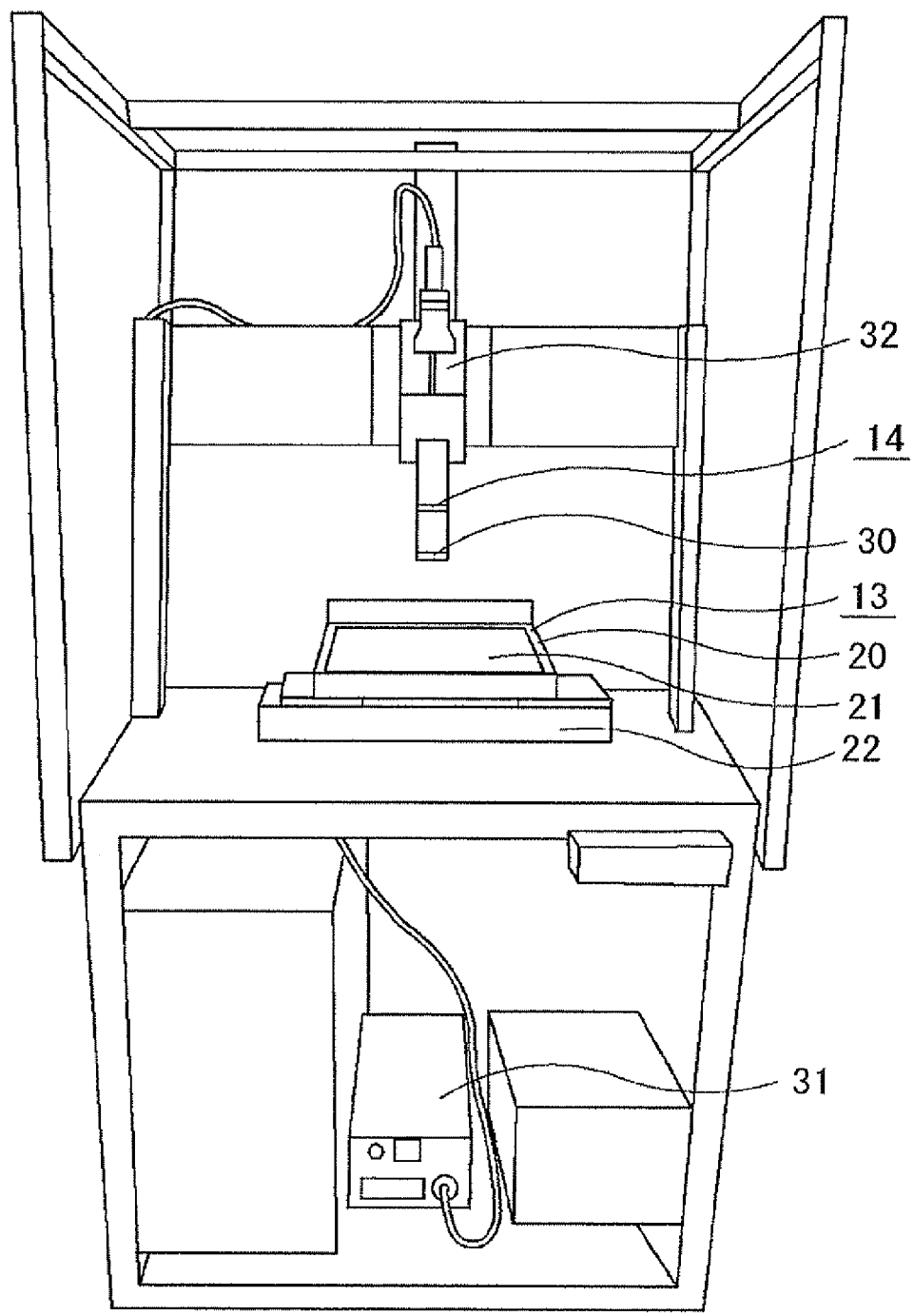
FIG. 18 is an outside view showing a slicing device.

As shown in FIG. 18, the slicing device 12 is provided with a work table 13 on which the rectangular pillar shaped sheet base material is mounted, and the ultrasonic cutter 14 that slices the sheet base material 11 on the work table 13, while applying ultrasonic wave vibrations thereto.

The work table 13 is provided with a silicone rubber 21 disposed on a movable carriage 20 made of metal. The movable carriage 20 is capable of moving in predetermined directions by a moving mechanism 22, and successively transfers the sheet base material 11 toward the lower portion of the ultrasonic cutter 14. The silicone rubber 21 has a thickness that sufficiently receives the blade edge of the ultrasonic cutter 14. When the sheet base material 11 is mounted on the silicone rubber 21, the work table 13 allows the movable carriage 20 to move in a predetermined direction in accordance with the slicing operation of the ultrasonic cutter 14, and successively transfers the sheet base material 11 toward the lower portion of the ultrasonic cutter 14.

The ultrasonic cutter 14 has a knife 30 for use in slicing the sheet base material 11, an ultrasonic oscillation mechanism 31 that applies ultrasonic wave vibrations to the knife 30 and a raising/lowering mechanism 32 that operates the knife 30 to be raised and lowered. The knife 30 has its blade edge directed to the work table 13, and when operated to be raised and lowered by the raising/lowering mechanism 32, it successively slices the sheet base material 11 mounted on the work table 13. The dimensions and material of the knife 30 are determined depending on the size, composition, etc. of the sheet base material 11, and for example, it is made of steel with a width of 40 mm, a thickness of 1.5 mm and a blade angle of 10°.

The ultrasonic oscillation mechanism 31, which applies ultrasonic wave vibrations to the knife 30 in a slicing direction of the sheet base material 11, has, for example, a transmission frequency of 20.5 kHz, with its amplitudes variably adjusted to 50 µm, 60 µm and 70 µm on three stages.

The slicing device 12 of this type successively slices the sheet base material 11 while applying ultrasonic wave vibrations to the ultrasonic cutter 14 so that the orientation of the carbon fibers of the thermally conductive sheet 10 can be maintained in the thickness direction.

Figure 19:
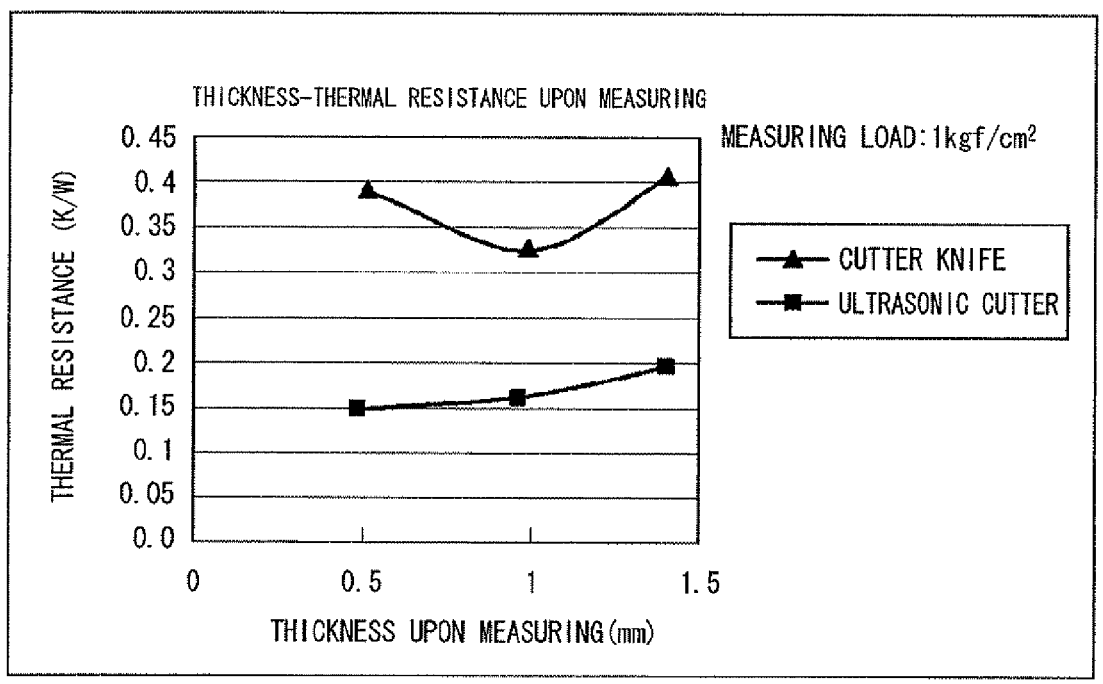
FIG. 19 is a graph that shows a relationship between a slicing method that depends on the present or absence of ultrasonic vibrations and a thermal resistance value of the thermally conductive sheet.

FIG. 19 shows thermal resistance values (K/W) of a thermally conductive sheet that was sliced without applying ultrasonic wave vibrations thereto and a thermally conductive sheet 10 that was sliced while ultrasonic wave vibrations being applied thereto by the slicing device 12. As shown in FIG. 19, it is found that, in comparison with the thermally conductive sheet sliced without applying ultrasonic wave vibrations thereto, the thermally conductive sheet 10 that was sliced while ultrasonic wave vibrations being applied thereto by the slicing device 12 has its thermal resistance (K/W) suppressed to a low level.

This is because of the fact that since the slicing device 12 applies ultrasonic wave vibrations to the ultrasonic cutter 14 in the slicing direction, the interface thermal resistance is low so that the carbon fibers oriented in the thickness direction of the thermally conductive sheet 10 are hardly pushed down sideward by the knife 30. In contrast, in the case of the thermally conductive sheet sliced without applying ultrasonic wave vibrations thereto, since the orientation of the carbon fibers serving as a thermally conductive material is disturbed by a frictional resistance of the knife, with the result that exposure thereof onto the cut surface is reduced to cause an increase in the thermal resistance. Therefore, by the use of the slicing device 12, it is possible to obtain a thermally conductive sheet 10 that is superior in thermal conductivity.

<Slicing Rate and Uniformity by Slice Thickness>

Next, examinations were carried out on a relationship between the slicing rate of the sheet base material 11 by the slicing device 12 and the thickness of the thermally conductive sheet 10 to be sliced. By using the compounding ratios shown in the aforementioned example (FIG. 16), a rectangular pillar shaped base material 11 of 20 mm in each side was formed, and this sheet base material 11 was sliced into thermally conductive sheets 10 having different thicknesses in a range from 0.05 mm to 0.50 mm for each 0.05 mm, with the slicing rate of the ultrasonic cutter 14 being varied at 5 mm, 10 mm, 50 mm and 100 mm per second, and the outside appearance of each of the thermally conductive sheets 10 was observed. In this case, the ultrasonic wave vibrations to be applied to the ultrasonic cutter 14 had a transmission frequency of 20.5 kHz and an amplitude of 60 µm.

The results of the observation are shown in FIG. 20. As shown in FIG. 20, under a thickness of 0.15 mm or less, a deformation was generated irrespective of the slicing rate. In contrast, in the case of the thickness of 0.20 mm or more, no deformation in the thermally conductive sheet 10 was observed even when the slicing rate was increased. In other words, in accordance with the slicing device 12, it is possible to uniformly slice the sheet base material 11 having the compounding ratios shown in FIG. 16 with a thickness of 0.20 mm or more.

<Thermal Conductivity and Compression Rate in Association with Slicing Rate and Slicing Thickness>

Next, examinations were carried out on relationships among the slicing rate, the thermal conductivity and the compression rate in the thickness direction of the sheet base material 11 caused by the slicing device 12. With respect to the respective thermally conductive sheets 10 having thicknesses of 0.20 mm, 0.25 mm, 0.30 mm and 0.50 mm formed at slicing rates at 5 mm, 10 mm, 50 mm and 100 mm per second, which had no deformation in the examinations of the slicing rate and the sheet thickness, the thermal conductivity and compression rate thereof were respectively measured. The results of measurements are shown in FIG. 21.

As shown in FIG. 21, among the respective thermally conductive sheets 10, those thermally conductive sheets 10 except for a sample with a sheet thickness of 0.50 mm had a superior thermal conductive characteristic in any of the cases in which it was sliced at any of rates of 5 mm, 10 mm and 50 mm per second of the ultrasonic cutter 14, and also had a compression rate of 10% or more, thereby providing superior flexibility and shape follow-up property. Moreover, even in the case when sliced at a rate of 100 mm per second of the ultrasonic cutter 14, the thermally conductive sheets 10 having a sheet thickness of 0.25 mm and 0.20 mm had a superior thermal conductive characteristic with a compression rate of 10% or more, thereby providing superior flexibility and shape follow-up property.

In contrast, in the case of the thermally conductive sheet 10 having a sheet thickness of 0.30 mm, when sliced at a rate of 100 mm per second of the ultrasonic cutter 14, its compression rate was slightly lowered to 3.72%, although its thermal conductive characteristic was superior.

In the case of the thermally conductive sheet 10 having a sheet thickness of 0.50 mm, even when sliced at any one of rates of 5 mm, 10 mm and 50 mm per second of the ultrasonic cutter 14, it is possible to provide a superior thermal conductive characteristic, and a compression rate of 5% or more, thereby making it possible to provide superior flexibility and shape follow-up property. On the other hand, in the case of the thermally conductive sheet 10 having a sheet thickness of 0.50 mm, when sliced at a rate of 100 mm per second of the ultrasonic cutter 14, its compression rate was lowered to 2.18% which was lower than 3%, although its thermal conductive characteristic was superior, causing degradation in flexibility and shape follow-up property.

<Amplitude and Compression Rate>

FIG. 22 shows respective characteristics of thermally conductive sheets 10 formed by being sliced, with the amplitude of ultrasonic wave vibrations to be applied to the ultrasonic cutter 14 being varied on three stages of 50 µm, 60 µm and 70 µm. The thermally conductive sheets 10 were formed based upon the compounding ratios shown in FIG. 16, with its measuring load being set to 1 kgf/cm². As shown in FIG. 22, in the case when the amplitude was set to 70 µm, the resulting thermally conductive sheet 10 had a compression rate of 2.18% that was lower than 3% in the same manner as in the conventional structure, causing degradation in flexibility and shape follow-up property. In contrast, in the case when the amplitude was set to 50 μm and 60 μm, the resulting thermally conductive sheet 10 had a compression rate of 3% or more, making it possible to provide superior flexibility and shape follow-up property.

<Others>

Additionally, not limited to the rectangular pillar shape, the sheet base material 11 may be formed into a pillar shape, such as a column shape, having various cross-sectional shapes in accordance with the shape of the thermally conductive sheet 10. Moreover, although spherical alumina was used as a filler agent, in addition to this, any one of spherical aluminum nitride, zinc oxide, silicon powder and metal powder may be used, or a mixture of these may also be used in the present invention.

INDUSTRIAL APPLICABILITY

In the case of a thermally conductive sheet produced by the method for producing a thermally conductive sheet of the present invention, since the surface roughness on a cut surface is small to subsequently provide a reduced thermal resistance, the thermal conductivity in the thickness direction becomes high; therefore, it can be desirably applied to peripheral parts of various devices, such as, for example, a CPU, an MPU, a power transistor, an LED, a laser diode, various batteries (various secondary batteries, such as lithium ion batteries, various fuel batteries, and various solar batteries, such as wet-type solar batteries, including capacitors, amorphous silicon, crystal silicon, compound semiconductors, etc.), which are adversely influenced in efficiency of element operations, service life, etc., depending on, for example, temperatures; and the peripheral parts of heat sources of heating apparatuses and the peripheral parts of heating pipes of heat exchangers and floor heating apparatuses in which heat needs to be effectively utilized.

REFERENCE SIGNS LIST

1 . . . anisotropic thermally conductive filler, 2 . . . filler, 10 . . . thermally conductive sheet, 11 . . . sheet base material, 12 . . . slicing device, 13 . . . work table, 14 . . . ultrasonic cutter, 20 . . . movable carriage, 21 . . . silicone rubber, 22 . . . moving mechanism, 30 . . . knife, 31 . . . ultrasonic oscillation mechanism, 32 . . . raising/lowering mechanism

The invention claimed is:

1. A thermally conductive sheet produced by the following steps:

extruding a thermally conductive composition containing a polymer, an anisotropic thermally conductive filler and another filler through an extruder, thereby extrusion molding an extrusion molded product in which the anisotropic thermally conductive filler is oriented along the extrusion direction;

curing the extrusion molded product to form a cured object; and cutting the cured object in a direction perpendicular to the extrusion direction into a given thickness with an ultrasonic cutter, wherein the anisotropic thermally conductive filler is prepared as carbon fibers and has an average fiber length of 100 μm or more, the other filler is prepared as spherical alumina particles and has an average particle size in a range from 1 μm to 40 μm, the carbon fibers are oriented in the range from 0° to 5° with respect to the thickness direction of the thermally conductive sheet, a peripheral portion on a surface of the thermally conductive sheet has a slight stickiness that is higher than that of an inside portion on the surface of the thermally conductive sheet, the inside portion of the thermally conductive sheet being encompassed by the peripheral portion of the thermally conductive sheet, the thermally conductive sheet has a cut surface having a surface roughness Ra of 9.9 μm of less, the polymer is a silicone resin, the spherical alumina particles are contained in a range from 40 to 55% by volume; and the carbon fibers are contained in a range from 10 to 25% by volume.

2. The thermally conductive sheet according to claim 1, wherein the other filler is contained in a range from 40.4 to 45.8% by volume, and the carbon fibers are contained in a range from 13.3 to 23.5% by volume.

3. The thermally conductive sheet according to claim 2, wherein 10 g or more of the carbon fibers are contained relative to 50 g of the other filler.

4. The thermally conductive sheet according to claim 3, wherein 16 g or less of the carbon fibers are contained relative to 50 g of the other filler.

5. The thermally conductive sheet according to claim 1, wherein the silicone resin contains polyalkenyl alkylsiloxane as a first silicone resin and polyalkyl hydrogen siloxane as a second silicone resin, and the silicone resin contains a larger amount of the first silicone resin than that of the second silicone resin, and the cured object has a compression rate of 3% or more when a predetermined load is applied by curing the extrusion molded product with a platinum catalyst.

* * * * *